(12) United States Patent
Xia et al.

(10) Patent No.: US 12,038,480 B2
(45) Date of Patent: Jul. 16, 2024

(54) ELECTRICAL SYSTEM WITH ON-LINE SAMPLING VERIFICATION FUNCTION AND VERIFICATION METHOD THEREOF

(71) Applicant: SHANGHAI ROYE ELECTRIC CO., LTD., Shanghai (CN)

(72) Inventors: Tiexin Xia, Shanghai (CN); Bing He, Shanghai (CN); Min Chang, Shanghai (CN); Zhengcao Guo, Shanghai (CN); Haiming Liao, Shanghai (CN); Haiyong Jin, Shanghai (CN); Enlin Wang, Shanghai (CN)

(73) Assignee: Shanghai Roye Electric Co., Ltd., Shanghai (CN)

( * ) Notice: Subject to any disclaimer, the term of this patent is extended or adjusted under 35 U.S.C. 154(b) by 342 days.

(21) Appl. No.: 17/640,776

(22) PCT Filed: Aug. 26, 2020

(86) PCT No.: PCT/CN2020/111252
§ 371 (c)(1),
(2) Date: Mar. 4, 2022

(87) PCT Pub. No.: WO2021/043040
PCT Pub. Date: Mar. 11, 2021

(65) Prior Publication Data
US 2022/0341993 A1 Oct. 27, 2022

(30) Foreign Application Priority Data
Sep. 4, 2019 (CN) .......................... 201910834369.5

(51) Int. Cl.
*G01R 31/327* (2006.01)
*G01N 9/00* (2006.01)
(Continued)

(52) U.S. Cl.
CPC ......... *G01R 31/3278* (2013.01); *G01N 9/002* (2013.01); *G01R 15/202* (2013.01);
(Continued)

(58) Field of Classification Search
CPC ............ G01R 31/3278; G01R 31/3271; G01R 31/327; H01H 33/563; H01H 35/28; G01N 9/26; G01N 9/00; G01D 21/02
(Continued)

(56) References Cited

U.S. PATENT DOCUMENTS

| | | | |
|---|---|---|---|
| 2022/0334184 A1* | 10/2022 | Chang | G01R 31/3278 |
| 2022/0336170 A1* | 10/2022 | Xia | H01H 35/32 |
| 2023/0160800 A1* | 5/2023 | Huang | G01R 31/327 |
| | | | 73/30.02 |

FOREIGN PATENT DOCUMENTS

| | | |
|---|---|---|
| CN | 101221217 | 7/2008 |
| CN | 102879733 | 1/2013 |
| (Continued) | | |

*Primary Examiner* — Giovanni Astacio-Oquendo
(74) *Attorney, Agent, or Firm* — Hsuanyeh Law Group, PC

(57) ABSTRACT

The application provides an electrical system with online sampling and check function and its check method for high-voltage and medium-voltage electrical equipment, including electrical equipment, gas density relay, gas density sensor, valve, pressure regulating mechanism, online check contact signal sampling unit and intelligent control unit. The pressure is increased or decreased by the pressure regulating mechanism to enable the contact action of the gas density relay of electrical equipment. The contact action is transmitted to the intelligent control unit through the online check contact signal sampling unit. The intelligent control unit detects the alarm and/or blocking contact signal operating value and/or return value according to the density value of the contact action; the check of the gas density relay can be completed without maintenance personnel on site, which (Continued)

greatly improves the reliability of the power grid and the work efficiency, and reduces the O&M cost. At the same time, it also realizes the mutual self-inspection between gas density relay and gas density sensor, and further realizes the maintenance-free.

18 Claims, 7 Drawing Sheets

(51) Int. Cl.
    *G01R 15/20*     (2006.01)
    *G01R 19/00*     (2006.01)
    *H01H 35/26*     (2006.01)

(52) U.S. Cl.
    CPC ......... *G01R 19/0092* (2013.01); *H01H 35/26* (2013.01); *G01N 2009/006* (2013.01)

(58) Field of Classification Search
    USPC ........ 324/418, 415, 422, 423, 421; 73/30.01
    See application file for complete search history.

(56) References Cited

FOREIGN PATENT DOCUMENTS

| | | |
|---|---|---|
| CN | 103245908 | 8/2013 |
| CN | 104698371 | 6/2015 |
| CN | 206804807 | 12/2017 |
| CN | 109752649 | 5/2019 |
| CN | 208818810 | 5/2019 |
| CN | 110456266 | 11/2019 |
| CN | 110535058 | 12/2019 |
| CN | 110554309 | 12/2019 |
| CN | 210863965 | 6/2020 |
| KR | 20150048286 | 5/2015 |

* cited by examiner

ELECTRICAL SYSTEM WITH ON-LINE SAMPLING VERIFICATION FUNCTION AND VERIFICATION METHOD THEREOF

This application requests the priority of the Chinese patent application (No. 201910834369.5) (invention name: electrical system with online sampling and check function and its check method) filed on Sep. 4, 2019.

TECHNICAL FIELD

The invention relates to the technical field of electric power, in particular to an electrical system (or electrical equipment) with an online check sampling function and a check method thereof applied to high-voltage and medium-voltage electrical equipment.

BACKGROUND

The gas density relay is generally configured to monitor and control the density of insulation gas in the high-voltage electrical equipment, a contact signal control loop is arranged inside, and a gas path of the gas density relay is communicated with the air chamber of the high-voltage electrical equipment. When gas leakage is detected, the contact of the gas density relay acts to generate a contact signal, and the contact signal control loop sends out an alarm or performs blocking according to the contact signal, so as to achieve the safety operation protection of the electrical equipment.

At present, SF6 (sulfur hexafluoride) electrical equipment has been widely applied to electric power departments and industrial and mining enterprises, and has promoted rapid development of electric power industry. If the density of SF6 gas in the air chamber of high-voltage electrical equipment decreases and the moisture content exceeds the standard, the safe operation of SF6 high-voltage electrical equipment will be seriously affected: 1) The decrease of SF6 gas density to a certain extent will lead to the loss of insulation and arc extinguishing performance. 2) With the participation of some metals, SF6 gas can hydrolyze with water at a temperature above 200° C., generate active HF and SOF2, corrode insulating parts and metal parts and generate a lot of heat to increase the pressure of the air chamber. 3) When the temperature is reduced, excessive water may form condensed water, which significantly reduces the surface insulation strength of the insulating parts, and even causes flashover and serious harm. Therefore, the power grid operating procedure compulsively stipulates that the density of SF6 gas and the water content should be tested regularly before and during operation of the equipment.

With the development of unattended substations towards networking and digitization and the increasing requirements of remote control and telemetry, the online monitoring of gas density and moisture content of SF6 electrical equipment is of great practical significance. With the continuous rapid development of China's smart power grids, as an important component and key node of a smart substation, smart high-voltage and medium-voltage electrical equipment plays a pivotal role in the safety of the smart power grids.

SUMMARY

The invention aims to provide an electrical system (or electrical equipment) with an online sampling check function and a check method thereof, so as to solve the problems raised in the above background.

In order to achieve the above purpose, the invention adopts the following technical scheme:

According to a first aspect, this application provides an electrical system with an online sampling check function, comprising:

electric equipment, in which an air chamber is arranged, and the air chamber is filled with insulating gas.

a gas density relay, which is mounted outside the air chamber of the electrical equipment, or mounted outside the air chamber of the electrical equipment via the valve;

The gas inlet of the valve is connected with the air chamber of the electrical equipment, and the gas outlet is connected with the gas path of the gas density relay.

The gas path of the pressure regulating mechanism is connected with the gas path of the gas density relay, and the pressure regulating mechanism is configured for pressure rise and fall of the gas path pressure of gas density relay, to enable the contact signal action of the gas density relay.

a gas density detection sensor, which is communicated with the gas density relay;

The online check contact signal sampling unit is connected with the gas density relay and configured to sample the contact signal of the gas density relay under the ambient temperature.

The intelligent control unit is respectively connected with the gas density sensor, the pressure regulating mechanism, the valve and the online check contact signal sampling unit; the unit is configured to manage the closing or opening of the valve, control the pressure regulating mechanism, collect pressure values and temperature values and/or gas density values, as well as check the contact signal operating value and/or contact signal return value of the gas density relay.

The contact signals include alarm signals and/or blocking signals.

Preferably, the electrical equipment includes SF6 gas electrical equipment, SF6 mixed gas electrical equipment, environmental protection gas electrical equipment, or other insulating gas electrical equipment.

Specifically, the electrical equipment includes a GIS, a GIL, a PASS, a circuit breaker, a current transformer, a voltage transformer, a transformer, an inflatable cabinet and a ring main unit.

Preferably, the electrical system comprises a support and the air chamber of the electrical equipment is located above or below the support. Preferably, the support comprises a vertical frame and a horizontal frame, the gas density relay is located in the internal space of the horizontal frame. The gas inlet of the valve is connected with one end of a connecting pipe, and the other end of the connecting pipe extends to the lower part of the gas chamber along the horizontal frame and connects the gas chamber from the lower part of the gas chamber.

Preferably, the gas density relay includes but is not limited to a gas density relay of bimetallic strip compensation, a gas density relay of gas compensation, a gas density relay of hybrid compensation of bimetallic strips and gas; a completely mechanical gas density relay, a digital gas density relay, a mechanical and digital combined gas density relay; a gas density relay with a pointer displaying function, a digital display type gas density relay, a gas density switch without a displaying or indicating function; an SF6 gas density relay, an SF6 hybrid gas density relay and an N2 gas density relay.

Preferably, the gas density sensor is arranged on the gas density relay. Alternatively, the pressure regulating mechanism is arranged on the gas density relay. alternatively, the gas density sensor, the online check contact signal sampling unit and the intelligent control unit are installed on the gas density relay.

More preferably, the gas density relay and the gas density detection sensor are of an integrated structure; and preferably, the gas density relay and the gas density detection sensor are a remote gas density relay of an integrated structure.

Preferably, the gas density detection sensor is structurally integrated.

More preferably, the gas density detection sensor is a structurally integrated gas density transmitter; preferably, the online check contact signal sampling unit and the intelligent control unit are arranged on the gas density transmitter.

Preferably, the gas density detection sensor includes at least one pressure sensor and at least one temperature transducer; alternatively, the gas density detection sensor is the gas density transmitter comprising the pressure sensors and the temperature transducers; alternatively, the gas density detection sensor is a density detection sensor adopting a quartz tuning fork technology.

More preferably, a probe of the pressure sensor is mounted on a gas path of the gas density relay.

More preferably, probes of the temperature transducers are mounted on or outside the gas path of the gas density relay, or mounted in the gas density relay, or mounted outside the gas density relay.

More preferably, the temperature transducer can be a thermocouple, a thermistor or a semiconductor sensor, a contact/non-contact sensor, or a thermal resistance and thermocouple.

More preferably, the pressure sensor includes but is not limited to a relative pressure sensor and/or an absolute pressure sensor.

Further, the pressure sensor may be a diffusion silicon pressure sensor, an MEMS pressure sensor, a chip pressure sensor, a coil induction pressure sensor (such as a pressure sensor where a Bourdon tube is attached with an induction coil), a resistance pressure sensor (such as a pressure sensor where a Bourdon tube is attached with a slide wire resistance), an analog pressure sensor and a digital pressure sensor.

More preferably, at least one temperature transducer is arranged near the temperature compensation element of the gas density relay or on the temperature compensation element, or integrated in the temperature compensation element. Preferably, at least one temperature transducer is arranged at one end, close to the temperature compensation element, of a pressure detector of the gas density relay, wherein the pressure detector is a Bourdon tube or a bellow, and the temperature compensation element uses a temperature compensation sheet or gas sealed in a housing.

More preferably, the intelligent control unit compares ambient temperature values with temperature values collected by the temperature transducers to complete the check of the temperature transducers.

Preferably, the valve is communicated with the electrical equipment through the connector. Preferably, the valve is a valve with electrically motorized operation, and/or a solenoid valve. More preferably, the valve is a permanent magnet solenoid valve. Preferably, the valve is a piezoelectric valve or temperature control valve or novel valve made of intelligent memory materials and opened or closed in an electrical heating manner.

Preferably, the valve is closed or opened in a hose bending or clamping manner.

Preferably, the valve is sealed in a cavity or housing.

Preferably, the valve and the pressure regulating mechanism are sealed in a cavity or a housing.

Preferably, pressure sensors are arranged on two sides of a gas path of the valve respectively; alternatively, pressure detectors are arranged on two sides of the gas path of the valve respectively.

Preferably, the pressure regulating mechanism are sealed in a cavity or a housing.

Preferably, during check, the pressure regulating mechanism is the sealed air chamber, and the heating element, and/or refrigeration element are provided inside or outside the sealed air chamber; heating through the heating element and/or refrigerating through the refrigeration element cause a gas temperature change in the sealed air chamber, and further completes the pressure rise and fall of gas density relay.

More preferably, the heating element and/or the refrigeration element are semiconductors.

More preferably, the pressure regulating mechanism also comprises a heat insulation element installed outside the sealed air chamber.

Preferably, during check, the pressure regulating mechanism is a cavity with an opening at one end, and the other end of the cavity is connected with the gas path of the gas density relay. a piston is set in the cavity. One end of the piston is connected with a regulating rod. The outer end of the regulating rod is connected with a drive part. The other end of the piston stretches into the opening and contacts with the inner wall of the cavity in a sealed manner. The drive part drives the regulating rod and further drives the piston moves in the cavity.

Preferably, during check, the pressure regulating mechanism is the sealed air chamber, the heating element, and/or refrigeration element are provided inside or outside the sealed air chamber, the hermetically sealed contacts exist between the piston and the inner wall of sealed air chamber, and the drive part is provided outside the sealed air chamber, and pushes the piston to move inside the cavity through the electromagnetic force.

Preferably, the pressure regulating mechanism is an airbag with one end connected to the drive part, the airbag changes in volume under the drive of the drive part, and the airbag is connected with the gas density relay.

Preferably, the pressure regulating mechanism is a bellows, one end of the bellows is connected with the gas density relay, and the other end of the bellows is retractable under the drive of the drive part.

The drive part in the pressure regulating mechanism induces but is not limited to one of magnetic force, a motor (inverter motor or stepping motor), a reciprocating motion mechanism, a Carnot cycle mechanism and a pneumatic element.

Preferably, the pressure regulating mechanism is a deflation valve.

More preferably, the pressure regulating mechanism further comprises a flow valve for controlling the gas release flow.

More preferably, the deflation valve is a solenoid valve or a valve with electrically motorized operation, or other deflation valves that are realized electrically or pneumatically.

More preferably, the deflation valve discharges the gas to the zero position, the intelligent control unit collects the pressure value at that time for comparison and completes the zero position check of the pressure sensor. The intelligence control unit or background compares the results for determination and gives an anomaly prompt that there is a problem with the pressure sensor if the error is out of tolerance.

Preferably, the pressure regulating mechanism is a compressor.

Preferably, the pressure regulating mechanism is a pump. More preferably, the pump includes, but is not limited to, a pressure pump, a booster pump, an electrical gas pump and an electromagnetic gas pump.

Preferably, the online check contact signal sampling unit and the intelligent control unit are arranged together.

More preferably, the online check contact signal sampling unit and the intelligent control unit are sealed in a cavity or housing.

Preferably, the contact signal sampling of the gas density relay by the online check contact signal sampling unit shall meet the following requirements: The online check contact signal sampling unit has at least two groups of independent sampling contacts, can automatically complete the check of at least two contacts at the same time, and can continuously measure without replacing contacts or reselecting contacts. The contact includes, but is not limited to, an alarm contact, an alarm contact+a blocking contact, an alarm contact+a blocking 1 contact+a blocking 2 contact, and an alarm contact+a blocking contact+an overpressure contact.

Preferably, the testing voltage of the online check contact signal sampling unit for contact signal operating values or switching values of the gas density relay is not lower than 24V, namely, voltage not lower than 24V is applied between corresponding terminals of contact signals during check.

A contact of the gas density relay is a normally-open density relay, the online check contact signal sampling unit includes a first connecting circuit and a second connecting circuit, the first connecting circuit is connected with the contact of the gas density relay and a contact signal control loop, and the second connecting circuit is connected with the contact of the gas density relay and the intelligent control unit; under a non-check state, the second connecting circuit is open or isolated, and the first connecting circuit is closed; under a check state, the online check contact signal sampling unit cuts off the first connecting circuit, connects the second connecting circuit, and connects the contact of the gas density relay with the intelligent control unit; alternatively, a contact of the gas density relay is a normally-closed density relay, the online check contact signal sampling unit includes the first connecting circuit and the second connecting circuit, the first connecting circuit is connected with the contact of the gas density relay and the contact signal control loop, and the second connecting circuit is connected with the contact of the gas density relay and the intelligent control unit; under the non-check state, the second connecting circuit is open or isolated, and the first connecting circuit is closed; under the check state, the online check contact signal sampling unit closes the contact signal control loop, cuts off the connection between the contact of the gas density relay and the contact signal control loop, connects the second connecting circuit, and connects the contact of the gas density relay with the intelligent control unit.

More preferably, the first connecting circuit comprises a first relay, the second connecting circuit comprises a second relay, the first relay is provided with at least one normally-closed contact, the second relay is provided with at least one normally-open contact, and the normally-closed contact and the normally-open contact are kept in opposite on-off states; the normally-closed contact is connected in series to the contact signal control loop, and the normally-open contact is connected to a contact of the gas density relay; under the non-check state, the normally-closed contact is closed, the normally-open contact is open, and the gas density relay monitors output statuses of the contacts in real time; under the check state, the normally-closed contact is open, the normally-open contact is closed, and a contact of the gas density relay is connected with the intelligent control unit by means of the normally-open contact. When the contact is a normally-closed density relay, corresponding adjustments may be made.

Further, the first relay and the second relay may be two independent relays or the same relay.

More preferably, the online check contact signal sampling unit is provided with a contact sampling circuit, which comprises a photocoupler and a resistance; the photocoupler comprises a LED and a phototransistor. the LED and the contact of the gas density relay are connected in series to form a closed circuit; the emitter of the phototransistor is grounded; the collector of the phototransistor is connected with the intelligent control unit, and the collector of the phototransistor is also connected to a power supply through the resistance.

when the contact is closed, the closed loop is powered on, the light-emitting diode emits light, the light turns on the phototriode, and the collector of the phototriode outputs a low level;

when the contact is open, the closed loop is powered off, the light-emitting diode does not emit light, the phototriode is cut off, and the collector of the phototriode outputs a high level.

More preferably, the online check contact signal sampling unit is provided with a contact sampling circuit, and the contact sampling circuit comprises a first photocoupler and a second photocoupler;

a light-emitting diode of the first photocoupler and a light-emitting diode of the second photocoupler are connected in parallel by current limiting resistors or directly, and then connected in series with contacts of the gas density relay to form a closed loop, and the light-emitting diodes of the first photocoupler and the second photocoupler are connected in opposite directions;

a collector of a phototriode of the first photocoupler and a collector of a phototriode of the second photocoupler are both connected to a power supply by means of voltage dividing resistors, an emitter of the phototriode of the first photocoupler and an emitter of the phototriode of the second photocoupler are connected to form an output end, and the output end is connected with the intelligent control unit and grounded by means of a resistor;

when the contact is closed, the closed loop is powered on, the first photocoupler is turned on, the second photocoupler is cut off, and the emitter of the phototriode of the first photocoupler outputs a high level; alternatively, the first photocoupler is cut off, the second photocoupler is turned on, and the emitter of the phototriode of the second photocoupler outputs a high level;

when the contact is open, the closed loop is powered off, both the first photocoupler and the second photocoupler are cut off, and the emitters of the phototriodes of the first photocoupler and the second photocoupler output a low level.

Further, the contact sampling circuit further comprises a first Zener diode group and a second Zener diode group, the first Zener diode group and the second Zener diode group are connected in parallel on the contact signal control loop, and the first Zener diode group and the second Zener diode group are connected in opposite directions; both the first Zener diode group and the second Zener diode group are composed of one, two or more Zener diodes connected in series. Alternatively, diodes can also be used instead of the Zener diodes.

Furthermore, the first Zener diode group comprises a first Zener diode and a second Zener diode connected in series, and a cathode of the first Zener diode is connected to an anode of the second Zener diode; the second Zener diode group comprises a third Zener diode and a fourth Zener diode connected in series, and an anode of the third Zener diode is connected to a cathode of the fourth Zener diode.

More preferably, the online check contact signal sampling unit is provided with a contact sampling circuit, and the contact sampling circuit comprises a first Hall current sensor and a second Hall current sensor; the first Hall current sensor, the second Hall current sensor and a contact of the gas density relay are connected in series to form a closed loop, and the contact of the gas density relay is connected between the first Hall current sensor and the second Hall current sensor; an output end of the first Hall current sensor and an output end of the second Hall current sensor are both connected to the intelligent control unit;

when the contact is closed, the closed loop is powered on, and current flows between the first Hall current sensor and the second Hall current sensor to generate an induced electromotive force;

when the contact is open, the closed loop is powered off, and no current flows between the first Hall current sensor and the second Hall current sensor to generate zero induced electromotive force.

More preferably, the online check contact signal sampling unit is provided with a contact sampling circuit, and the contact sampling circuit comprises: a first silicon controlled rectifier, a second silicon controlled rectifier, a third silicon controlled rectifier and a fourth silicon controlled rectifier;

the first silicon controlled rectifier and the third silicon controlled rectifier are connected in series, the second silicon controlled rectifier and the fourth silicon controlled rectifier are connected in series and then form a series-parallel closed loop together with a series circuit formed by the first silicon controlled rectifier and the third silicon controlled rectifier, one end of a contact of the gas density relay is electrically connected with the circuit between the first silicon controlled rectifier and the third silicon controlled rectifier by a line, and the other end is connected with the circuit between the second silicon controlled rectifier and the fourth silicon controlled rectifier by a line.

Further, a cathode of the first silicon controlled rectifier is connected with the intelligent control unit, and an anode of the first silicon controlled rectifier is connected with a cathode of the third silicon controlled rectifier; control electrodes of the first silicon controlled rectifier and the third silicon controlled rectifier are connected with the intelligent control unit; a cathode of the second silicon controlled rectifier is connected with the intelligent control unit, and an anode of the second silicon controlled rectifier is connected with a cathode of the fourth silicon controlled rectifier; and control electrodes of the second silicon controlled rectifier and the fourth silicon controlled rectifier are connected with the intelligent control unit.

Preferably, the intelligent control unit obtains the gas density value collected by the gas density sensor. Alternatively, the intelligent control unit obtains the pressure value and temperature value collected by the gas density sensor to complete the online monitoring of the gas density by the gas density relay. That is to complete the online monitoring of the gas density of the monitored electrical equipment by the gas density relay.

More preferably, the intelligent control unit calculates the gas density value by an averaging method (mean value method), wherein the averaging method is: in a set time interval, the collection frequency is set, and average calculation is carried out on all the N gas density values at different time points, so as to obtain the gas density value; alternatively, Alternatively, in a set time interval, a temperature interval step is set, and the density values corresponding to N different temperature values collected in all temperature ranges are calculated for the average value to obtain the gas density value. alternatively, In a set time interval, a pressure interval step is set, and the density values corresponding to N different pressure values collected in all pressure change ranges are calculated for the average value to obtain the gas density value.

N is a positive integer greater than or equal to 1.

Preferably, the intelligent control unit acquires the gas density values collected by the gas density detection sensor when the gas density relay performs contact signal operating or switching, and online check of the gas density relay is achieved; alternatively, The intelligent control unit acquires the pressure value and temperature value collected by the gas density sensor when the contact signal of the gas density relay body is operated or switched, and converts them into the pressure value corresponding to 20° C. according to the gas pressure-temperature characteristics, that is, the gas density value, and completes the online check of the gas density relay.

Preferably, the gas density relay has relative density value output signals which are connected with the intelligent control unit; alternatively, the gas density relay has relative pressure value output signals which are connected with the intelligent control unit.

More preferably, when the gas density relay outputs relative density value output signals, the intelligent control unit collects a current gas density value for comparison to complete check on relative density values of the gas density relay, and the intelligent control unit or background performs determination on the comparison result and issues, if the error is out of tolerance, an abnormal prompt; alternatively, when the gas density relay outputs relative density value output signals, the intelligent control unit collects a current gas density value for comparison to complete mutual check on the gas density relay and the gas density detection sensor, and the intelligent control unit or background performs determination on the comparison result and issues, if the error is out of tolerance, an abnormal prompt; alternatively, when the gas pressure relay outputs relative pressure value output signals, the intelligent control unit collects a current pressure value for comparison to complete mutual check on the gas pressure relay and the gas pressure detection sensor, and the intelligent control unit or background performs determination on the comparison result and issues, if the error is out of tolerance, an abnormal prompt.

Preferably, the electrical system with the online sampling check function in the present application comprises at least two gas density detection sensors, and each gas density detection sensor comprises a pressure sensor and a temperature transducer; gas density values detected by the gas density detection sensors are compared to complete mutual check on the gas density detection sensors.

Preferably, the gas density detection sensor comprises at least two pressure sensors, and pressure values collected by the pressure sensors are compared to complete mutual check on the pressure sensors.

Preferably, the gas density detection sensor comprises at least two temperature transducers, and temperature values collected by the temperature transducers are compared to complete mutual check on the temperature transducers.

Preferably, the gas density sensor comprises at least one pressure sensor and at least one temperature transducer; the pressure value collected by each pressure sensor and the temperature value collected by each temperature transducer are randomly arranged and combined, and each combination is converted into multiple pressure values corresponding to 20° C. according to the gas pressure temperature characteristics, that is, the gas density value. Each gas density value is compared to complete the mutual check of each pressure sensor and each temperature transducer; alternatively, the pressure value collected by each pressure sensor and the temperature value collected by each temperature transducer are all arranged and combined, and each combination is converted into multiple pressure values corresponding to 20° C. according to the gas pressure temperature characteristics, that is, the gas density value. Each gas density value is compared to complete the mutual check of each pressure sensor and each temperature transducer; alternatively, the multiple gas density values obtained by each pressure sensor and temperature transducer are compared with the output signal of the gas density relay, to complete the mutual check of the gas density relay, pressure sensor and temperature transducer.

Preferably, after the gas density relay completes the check, the electrical system automatically generates a check report of the gas density relay, sends an alarm in case of abnormality, and uploads the check report to a far end or sends the check report to a designated receiver.

Preferably, based on an embedded algorithm and control program of an embedded system of a microprocessor, the intelligent control unit automatically controls the whole check process, including all peripherals, logic, input and output.

More preferably, based on embedded algorithms and control programs of a general computer, an industrial control computer, an ARM chip, an AI chip, a CPU, an MCU, an FPGA, a PLC, an industrial control main board, an embedded master control board and the like, the intelligent control unit automatically controls the whole check process, including all peripherals, logic, input and output.

Preferably, the intelligent control unit is provided with an electrical interface, which completes test data storage, and/or test data export, and/or test data printing, and/or data communication with an upper computer, and/or analog and digital information input.

Preferably, the intelligent control unit further includes a communication module for remote transmission of test data, and/or check results.

More preferably, the communication mode of the communication module is a wire communication or wireless communication mode.

Further, the wire communication mode includes one or several types of RS232 bus, RS485 bus, CAN-BUS, 4-20 mA, Hart, IIC, SPI, Wire, coaxial cable, power line carrier (PLC) and cable line.

Further, the wireless communication mode includes one or several types of NB-IOT, 2G/3G/4G/5G, WIFI, Bluetooth, Lora, Lorawan, Zigbee, infrared, ultrasonic, acoustic, satellite, light wave, quantum communication and sonar in one or several.

Preferably, the intelligent control unit is further provided with a clock, and the clock is configured to regularly set the check time of the gas density relay, or record test time, or record event time.

Preferably, the intelligent control unit performs control through field control, and/or background control.

More preferably, the electrical system completes the online check of the gas density relay according to the background setting or instruction. Alternatively, the online check of the gas density relay is completed according to the set check time of the gas density relay.

Preferably, circuits of the intelligent control unit include an intelligent control unit protection circuit, and the intelligent control unit protection circuit includes, but is not limited to one or more of an anti-static interference circuit (such as ESD, EMI), an anti-surge circuit, an electrical fast protection circuit, an anti-radio frequency field interference circuit, an anti-burst interference circuit, a power supply short-circuit protection circuit, a power supply reverse-connection protection circuit, an electrical contact misconnection protection circuit, and a charging protection circuit.

Preferably, the electrical system further comprises a multichannel joint, and the gas density relay, the valve and the pressure regulating mechanism are arranged on the multichannel joint; alternatively, the intelligent control unit is arranged on the multichannel joint.

More preferably, a gas path of the gas density relay is connected to a first joint of the multichannel joint; a gas path of the pressure regulating mechanism is connected to a second joint of the multichannel joint, and the first joint is connected to the second joint, so as to connect the gas path of the pressure regulating mechanism with the gas path of the gas density relay; a gas outlet of the valve is connected to a third joint of the multichannel joint, the third joint is connected to the first joint, so as to connect the gas outlet of the valve with the gas path of the pressure regulating mechanism and/or the gas path of the gas density relay.

Further, a connecting portion butted with the electrical equipment is provided at the third joint of the multichannel joint, and the valve is embedded in the connecting portion.

More preferably, the housing of the gas density relay is provided with a connector, and the connector is fixed in the air chamber of the electrical equipment; or, preferably, the housing of the gas density relay is fixed on the multichannel joint, and the multichannel joint is fixed in the air chamber.

Preferably, the gas density relay, the valve and the pressure regulating mechanism are connected together through a connecting pipe.

More preferably, the gas path of the pressure regulating mechanism is connected with the gas path of the gas density relay through the first connecting pipe. The gas outlet of the valve is directly connected with the gas path of the gas density relay through the second connecting pipe, or the gas outlet of the valve is connected with the gas path of the pressure regulating mechanism through the second connecting pipe, so as to connect the gas outlet of the valve with the gas path of the gas density relay.

Preferably, the electrical system further comprises a self-sealing valve which is mounted between the electrical equipment and the valve; alternatively, the valve is mounted between the electrical equipment and the self-sealing valve.

Preferably, the electrical system further comprises an air admission interface.

More preferably, the air admission interface is arranged on the pressure regulating mechanism; alternatively, the air admission interface is arranged on the electrical equipment; alternatively, the air admission interface is arranged on the multichannel joint; alternatively, the air admission interface is arranged on the self-sealing valve.

More preferably, the electrical system can count the number of gas make-up times, gas make-up volume or gas make-up time.

Preferably, the electrical system can perform online air admission.

Preferably, the electrical system can perform online gas drying.

Preferably, the electrical system also includes a display interface for HMI, which is connected with the intelligent control unit to display the current check data in real time and/or support data input. Specifically, the display includes real-time online gas density value display, pressure value display, temperature value display, change trend analysis, historical data query, real-time alarm, etc.

More preferably, the electrical system supports input of basic information of the gas density relay, and the basic information includes but is not limited to one or more of factory numbers, precision requirements, rated parameters, manufacturers and operation positions.

Preferably, the electrical system further includes micro-water sensors, which are respectively connected with the gas density relay and the intelligent control unit.

More preferably, the electrical system further includes a gas circulation mechanism, which is respectively connected with the gas density relay and the intelligent control unit and comprises a capillary tube, a seal chamber and a heating element, gas flow is achieved by heating with the heating element, and micro-water values inside the gas are monitored online.

Further, the micro-water sensors may be mounted in the seal chamber and the capillary tube of the gas circulation mechanism, at an orifice of the capillary tube or outside the capillary tube.

Preferably, the electrical system further includes decomposition product sensors, which are respectively connected with the gas density relay and the intelligent control unit.

Preferably, the electrical system further includes a camera for monitoring.

Preferably, the electrical system monitors online gas density values, or density values, pressure values and temperature values; alternatively, the electrical system remotely monitors gas density values, or density values, pressure values and temperature values.

Preferably, the electrical system has a self-diagnosis function and can timely give notice about anomalies. Such as notices for disconnection, short circuit alarm and sensor damage.

Preferably, the electrical system has a safety protection function: when a gas density value or a pressure value is less than a set value, the electrical system automatically stops check and sends out a notice signal.

Preferably, the electrical system is provided with a heater and/or a radiator (e.g., a fan), the heater is turned on when the temperature is less than a set value, and the radiator (e.g., a fan) is turned on when the temperature is higher than the set value.

Preferably, the gas density relay also includes a contact resistance detection unit, which is connected with the contact signal or directly connected with the signal generator in the gas density relay. Under the control of the online check contact signal sampling unit, the contact signal of the gas density relay is isolated from its control loop. When the contact signal of the gas density relay moves and/or when the contact signal of the gas density relay receives the instruction to detect the contact resistance, the contact resistance detection unit can detect the contact resistance value of the contact point of the gas density relay.

Preferably, the gas density relay also includes an insulation resistance detection unit, which is connected with the contact signal or directly connected with the signal generator in the gas density relay. Under the control of the online check contact signal sampling unit, the contact signal of the gas density relay is isolated from its control loop. When the contact signal of the gas density relay moves and/or when receiving the instruction to detect the insulation resistance of the contact, the insulation resistance detection unit can detect the contact resistance value of the gas density relay, and then detect the insulation performance of the gas density relay.

In the second aspect, the present application provides a gas density relay check method, which includes:

in a normal working state, the gas density relay monitors the gas density value in the electrical equipment;

According to the set check time and gas density value, and under the condition that the check of the gas density relay is permitted, the gas density relay:

The valve is closed via the intelligent control unit;

The pressure regulating mechanism is driven by the intelligent control unit to slowly decrease the gas pressure and enable the contact action of the gas density relay. The contact action is transmitted to the intelligent control unit through the online check contact signal sampling unit. The intelligent control unit obtains the gas density value according to the pressure value and temperature value during the contact action, or directly obtains the gas density value, detects the contact signal operating value of the gas density relay, and completes the check of the contact signal operating value of the gas density relay.

When all the check of contact signals is completed, the intelligent control unit opens the valve.

Preferably, the gas density relay check method includes:

in a normal working state, the gas density relay monitors the gas density value in the electrical equipment, and at the same time, the gas density relay monitors the gas density value in the electrical equipment online via a gas density detection sensor and the intelligent control unit;

According to the set check time and gas density value, and under the condition that the check of the gas density relay is permitted, the gas density relay:

The valve is closed via the intelligent control unit;

The online check contact signal sampling unit is adjusted to the check state. In the check state, the online check contact signal sampling unit cuts off the contact signal control loop of the gas density relay and connects the contact of the gas density relay to the intelligent control unit.

The pressure regulating mechanism is driven by the intelligent control unit to slowly decrease the gas pressure and enable the contact action of the gas density relay. The contact action is transmitted to the intelligent control unit through the online check contact signal sampling unit. The intelligent control unit obtains the gas density value according to the pressure value and temperature value during the contact action, or directly obtains the gas density value, detects the contact signal operating value of the gas density relay, and completes the check of the contact signal operating value of the gas density relay.

The pressure regulating mechanism is driven by the intelligent control unit to slowly increase the gas pressure and enable the contact reset of the gas density relay. The contact reset is transmitted to the intelligent control unit through the online check contact signal sampling unit. The intelligent control unit obtains the gas density value according to the pressure value and temperature value during the contact reset, or directly obtains the gas density value, detects the contact signal return value of the gas density relay, and completes the check of the contact signal return value of the gas density relay.

When all the check of contact signals is completed, the intelligent control unit opens the valve and adjusts the online check contact signal sampling unit to the working state, and the contact signal control loop of the gas density relay returns to the normal operation state.

Preferably, the contact signals include alarm signals and/or blocking signals.

Preferably, the gas density detection sensor includes at least one pressure sensor and at least one temperature transducer; alternatively, the gas density detection sensor is the gas density transmitter comprising the pressure sensors and the temperature transducers; alternatively, the gas density detection sensor is a density detection sensor adopting a quartz tuning fork technology.

Preferably, the gas density relay can send alarm automatically in case of abnormality upon completion of check, and upload to remote or send to designated receiver.

Preferably, the check method further includes: displaying gas density values and check results in field or displaying the gas density values and the check results through the background.

Preferably, the check method also includes the field control and/or background control of the intelligent control unit.

Compared with the prior art, the technical scheme of the invention has the following advantages:

The application provides an electrical system with online sampling and check function and its check method for high-voltage electrical equipment, including electrical equipment, gas density relay, gas density sensor, pressure regulating mechanism, valve, online check contact signal sampling unit and intelligent control unit. The valve is closed through the intelligent control unit so that the gas density relay is isolated from the electrical equipment in the gas path. The pressure is increased or decreased by the pressure regulating mechanism to enable the contact action of the gas density relay. The contact action is transmitted to the intelligent control unit through the online check contact signal sampling unit. The intelligent control unit detects the alarm and/or blocking contact signal operating value and/or return value of the gas density relay according to the density value of the contact action; the check of the gas density relay can be completed without maintenance personnel on site, which improves the reliability of the power grid and the work efficiency, and reduces the O&M cost. Meanwhile, the whole check process of the invention can achieve zero emission of SF$_6$ gas and meet the requirements of environmental protection regulations.

BRIEF DESCRIPTION OF THE DRAWINGS

Drawings for constituting a part of the present application are used to provide further understanding of the present application, and exemplary embodiments of the present application and descriptions thereof are used to explain the present application, and do not constitute improper limitation to the present application. In the drawings.

DETAILED DESCRIPTION OF THE EMBODIMENTS

In order to make the purpose, the technical scheme and the advantages of the invention more clear and definite, the invention is further elaborated hereafter with reference to the drawings and examples. It should be understood that the specific embodiments described herein are only used to explain the invention, and cannot play a role in limiting the invention.

Embodiment I

Figure 1:
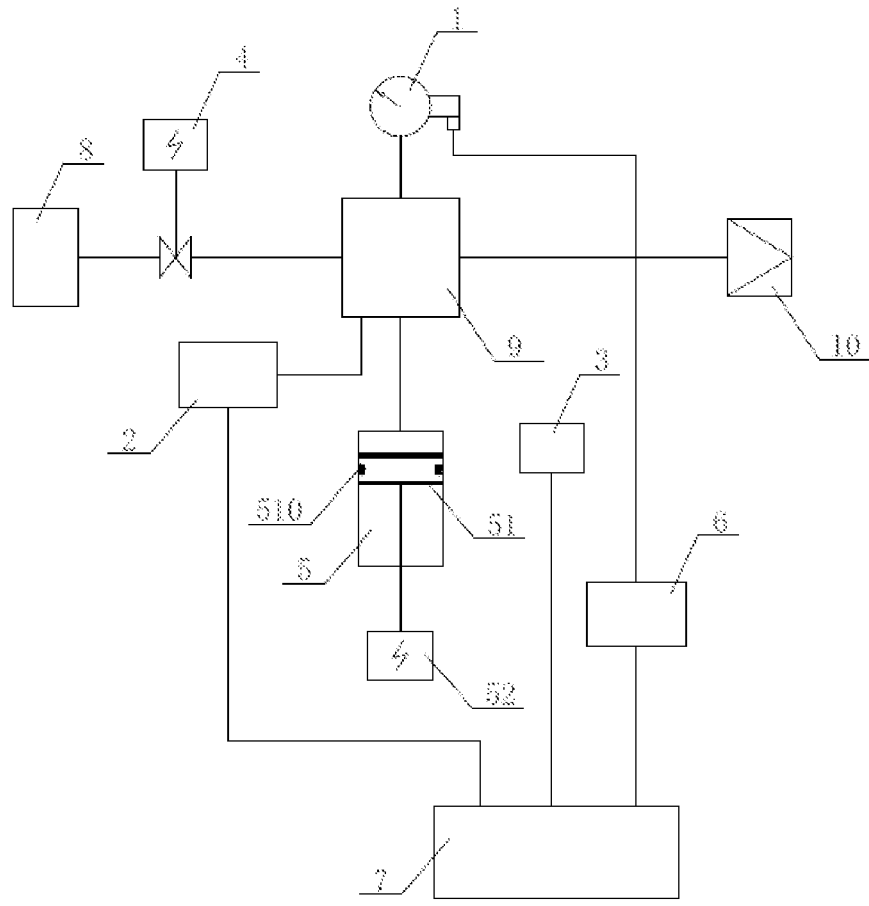
FIG. 1 is structural diagram of electrical system with online sampling check function of embodiment 1.

As shown in FIG. 1, the electrical system with online sampling and check function provided in Embodiment 1 of the invention includes electrical equipment 8, gas density relay 1, pressure sensor 2, temperature transducer 3, valve 4, pressure regulating mechanism 5, online check contact signal sampling unit 6, intelligent control unit 7, multichannel joint 9 and air admission interface 10. The gas density relay 1, valve 4, pressure sensor 2, pressure regulating mechanism 5 and air admission interface 10 are arranged on the multichannel joint 9.

Specifically, the electrical equipment 8 is internally provided with an air chamber filled with insulating gas. The gas inlet of valve 4 is sealed and connected to the electrical equipment 8 and connected with the air chamber of the electrical equipment 8, and the gas outlet of valve 4 is connected with the gas density relay 1 through the multichannel joint 9. The pressure sensor 2 is connected with the gas density relay 1 on the gas path through a multichannel joint 9. The pressure regulating mechanism 5 is connected with the gas density relay 1 through the multichannel joint 9. The online check contact signal sampling unit 6 is connected respectively with the gas density relay 1 and the intelligent control unit 7. The valve 4, pressure sensor 2, temperature transducer 3 and pressure regulating mechanism 5 are respectively connected with the intelligent control unit 7. The air admission interface 10 is connected with the multichannel joint 9.

Figure 2:
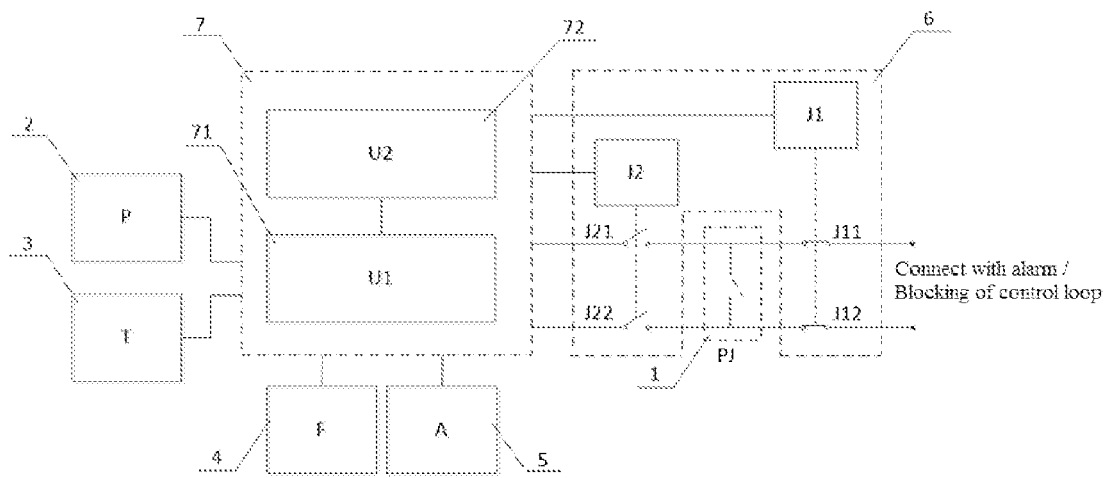
FIG. 2 is control circuit diagram of electrical system of embodiment 1.

FIG. 2 is control circuit schematic diagram of a electrical system with online sampling check function of embodiment 1. As shown in FIG. 2, the online check contact signal sampling unit 6 of this embodiment is provided with a protection circuit, including the first connection circuit and the second connection circuit. The first connecting circuit is connected with the contact of the gas density relay 1 and the contact signal control loop, and the second connecting circuit is connected with the contact of the gas density relay 1 and the intelligent control unit 7. In the non-check state, the second connecting circuit is disconnected and the first connecting circuit is closed. In the check state, the online check contact signal sampling unit 6 cuts off the first connecting circuit, connects the second connecting circuit and connects the contact of the gas density relay 1 with the intelligent control unit 7.

Specifically, the first connecting circuit includes a first relay J1, and the second connecting circuit includes a second relay J2. The first relay J1 is provided with normally closed contacts J11 and J12, which are connected in series in the contact signal control loop. The second relay J2 is provided with normally open contacts J21 and J22, which are connected to the contact $P_J$ of the gas density relay 1. Alternatively, the first relay J1 and the second relay J2 are integrated, that is, the relay with normally open/normally closed contacts. In the non-check state, the normally closed contacts J11 and J12 are closed, the normally open contacts J21 and J22 are disconnected, and the gas density relay monitors the output state of the contact PJ in real time. In the check state, the normally closed contacts J11 and J12 are disconnected, the normally open contacts J21 and J22 are closed, and the contact $P_J$ of the gas density relay 1 is connected with the intelligent control unit 7 through the normally open contacts J21 and J22.

The intelligent control unit 7 is mainly composed of a processor 71 (U1) and a power supply 72 (U2). The processor 71 (U1) GPC, industrial control computer, CPU, single chip microcomputer, ARM chip, AI chip, MCU, FPGA, PLC, industrial control main board, embedded master control board and other intelligent integrated circuits. The power supply 72(U2) can be switching power supply, 220V AC, DC power supply, LDO, programmable power supply, solar energy, storage battery, rechargeable battery and battery. The pressure sensor 2 of the Pressure collector P can be a pressure sensor, a pressure transmitter and other pressure sensing elements. The temperature transducer 3 of the temperature collector T can be a temperature transducer, a temperature transmitter and other temperature sensing elements. Valve 4 can be an element that can open and close the gas path and even control the flow, such as solenoid valve, valve with electrically motorized operation, pneumatically operated valve, ball valve, needle valve, control valve and stop valve. The semi-automatic valve may also be the manual valve. The pressure regulating mechanism 5 can be an electric regulating piston, an electric adjusting cylinder, a booster pump, a gas cylinder pressurizer, a valve, a solenoid valve, a flow controller. The semi-automatic valve may also be the pressure regulating mechanism that is manually regulated.

Operating Principles:

The intelligent control unit 7 monitors the gas pressure P and temperature T of the electrical equipment with pressure sensor 2 and temperature transducer 3, and obtains the pressure value $P_{20}$ (i.e. gas density value) under the corresponding temperature of 20° C. When the gas density relay 1 needs to be checked, if the gas density value $P_{20}$ is equal to or greater than the set safety check density value PS, the intelligent control unit 7 controls the closing of valve 4 to isolate the gas density relay 1 from the electrical equipment 8 on the gas path.

Then the intelligent control unit 7 disconnects the contact signal control loop of the gas density relay 1, i.e. normally closed contacts of J11 and J12 of the first relay J1 of the online check contact signal sampling unit 6 are disconnected, which prevents impact on safe operation of the electrical equipment 8 during online check of the gas density relay 1, sending of alarm signal by mistake during the check or blocking of control circuit. Since monitoring and judgement that prove gas density value $P_{20}$ is greater than or equal to the set safety check density value PS have been conducted prior to start of the check, gas of the electrical equipment 8 is within the range of safe operation, and gas leakage is a slow process, so it's safe during the check. Meanwhile, the intelligent control unit 7 connects contact sampling circuit of the contact of gas density relay 1, i.e. normally open contacts of J21 and J22 of the second relay J2 of the online check contact signal sampling unit 6 are closed, and the contact $P_J$ of the gas density relay 1 is connected with the intelligent control unit 7 by the normally open contacts of J21 and J22 of the second relay J2 at this time.

Then, the intelligent control unit 7 controls the drive part 52 (it can be realized through motor and gear. The methods are diversified and flexible) of the pressure regulating mechanism 5 so that the volume of the pressure regulating mechanism 5 changes. Since the gas pressure of the gas density relay 1 gradually drops, enable the contact signal action of the gas density relay 1 and upload the contact signal action to the intelligent control unit 7 through the second relay J2 of the online check contact signal sampling unit 6. According to the pressure value P (it is converted to the corresponding pressure value $P_{20}$ (density value) at 20° C. according to the gas characteristics) and temperature value T measured during contact action, the intelligent control unit 7 can detect the contact action value $P_{D20}$ of the gas density relay 1. After all the contact signal operating values of alarm and/or blocking signal of the gas density relay 1 are detected, the motor (motor or variable frequency motor) of the pressure regulating mechanism 5 is controlled and the pressure regulating mechanism 5 is regulated through the intelligent control unit 7, so that the gas pressure of the gas density relay 1 rises gradually until the return value of the alarm and/or blocking contact signal of the gas density relay 1 is detected. The mean value is calculated upon repeated checks for several times (such as 2-3 times), and thus the check of the gas density relay is completed.

Upon completion of the check, the normally open contacts of J21 and J22 of the second relay J2 of the online check contact signal sampling unit 6 are disconnected, and contact $P_J$ of gas density relay 1 is disconnected to the intelligent control unit 7 through disconnection of the normally open contacts of J21 and J22 of the second relay J2 at this time. Control valve 4 of the intelligent control unit 7 is opened so that the gas density relay body 1 is connected with the electrical equipment 8 in the gas path. Then the normally closed contacts of J11 and J12 of the first relay J1 of the online check contact signal sampling unit 6 are closed, contact signal control loop of the gas density relay 1 works normally, and the gas density relay monitors gas density of the electrical equipment 8 in a safe manner, which ensures safe and reliable operation of the electrical equipment 8. In this way, it is convenient to complete the online check of gas density relay, and the safe operation of electrical equipment 8 will not be affected.

When the gas density relay 1 completes check, the electrical system makes a decision and announces the test result. The mode is flexible: 1) The electrical system can give an announcement locally, e.g. display through the indicator light, digital or liquid crystal; 2) or upload the result through online remote communication, e.g. the test can be uploaded to the background of the online monitoring system; 3) or the result can be wirelessly uploaded to a special terminal, such as mobile phone; 4) or the result can be uploaded through other approaches; 5) or the anomaly can be uploaded through alarm signal or special signal; 6) the result can be uploaded alone or together with other signals. In short, after the electrical system completes the online check of the gas density relay 1, if an abnormality is provided, the electrical system may automatically send an alarm, may upload the abnormality to a distal end, or may send the abnormality to a designated receiver, such as the mobile phone. Alternatively, after the check is completed, if any abnormality is provided, the intelligent control unit 7 may upload the abnormality to the distal end (a monitoring room, a background monitoring platform, etc.) via an alarm contact signal of the gas density relay 1, and may also display and notify the abnormality locally. For a simple version of the online check, a check result with the abnormality may be uploaded by the alarm signal wire. The abnormal check result can be uploaded regularly. If an abnormality is provided, a contact is connected to the alarm signal contact in parallel to be closed and disconnected regularly, and the condition can be obtained via analysis; or abnormal check result is uploaded by the independent check signal line. To be specific, good conditions or anomalies may be uploaded. In addition, the check result can be uploaded through the separate check signal or displayed and alarmed locally. As well, it may be uploaded wirelessly or uploaded through networking with a smartphone. The communication mode can be wired or wireless. The wire communication mode can be RS232 bus, RS485 bus, CAN-BUS and other industrial buses, optical fiber Ethernet, 4-20 mA, Hart, IIC, SPI, Wire, coaxial cable and power line carrier (PLC). The wireless communication mode can be 2G/3G/4G/5G, WIFI, Bluetooth, Lora, Lorawan, Zigbee, infrared, ultrasonic wave, sound wave, satellite, optical wave, quantum communication, sonar and 5G/NB-IOT communication module (such as NB-IOT) built in the sensor. In short, a plurality of ways and a plurality of combinations may be provided to ensure the reliable performance of the gas density relay completely.

The gas density relay has the function of safety protection. That is, when a gas density value is less than a setting value, the gas density relay automatically stops the online check of the gas density relay 1 and sends out a notice signal. For example, when the gas density value is less than the setting value $P_S$, the check is not performed again. Only when the gas density value is greater than or equal to (an alarm pressure value+0.02 MPa), the online cheek may be performed.

The electrical system may perform the online check according to a setting time, or perform the online check according to a setting temperature (such as an extreme high temperature, a high temperature, an extreme low temperature, a low temperature, a normal temperature, 20° C., etc.). The error judgment requirements are different for online check at high temperature, low temperature, normal temperature and 20° C. ambient temperature. For example, for check at 20° C. ambient temperature, the accuracy requirements of gas density relay can be level 1.0 or 1.6, or level 2.5 at high temperature. Specifically, it can be implemented according to the temperature requirements and the related standards. For example, according to the regulations of the temperature compensation performance in article 4.8 of DL/T 259 Calibration Regulation for SF6 Gas Density Monitor, and the precision requirement corresponding to each temperature value.

The electrical system may compare the error performance of the gas density relay 1 in different periods under different temperatures according to the gas density relay 1. That is, the electrical system compares the error performance of the gas density relay 1 and the performance of the electrical equipment 8 in different periods and within the same temperature range. The performance of the gas density relay 1 and the performance of the electrical equipment 8 are determined and compared in various historical periods and between history and the present.

The electrical equipment may be checked repeatedly for a plurality of times (such as 2-3 times), and an average value of the electrical equipment is calculated according to each check result. If necessary, the online check may be performed to the gas density relay at any time.

The gas density relay 1 includes: a gas density relay with bimetal compensation, a gas density relay with gas compensation, or a gas density relay of a mixed type of the bimetal and the gas compensation; a fully mechanical gas density relay, a digital gas density relay relay, and a gas density relay with a mixed mechanical and digital type; a density relay with indication (a density relay with a pointer display, a density relay with the digital display, or a density relay with the liquid crystal display), and a density relay without indication (i.e., a density switch); an SF6 gas density relay, an SF6 mixed gas density relay, an N2 gas density relay, other gas density relays, etc.

Among them, there can be several types of pressure sensor 2, including absolute pressure sensors, relative pressure sensors, or absolute pressure sensors and relative pressure sensors. The form of the pressure sensor may be a diffusion silicon pressure sensor, a MEMS pressure sensor, a chip pressure sensor, a coil induction pressure sensor (such as a pressure measuring sensor of an induction coil on a Bourdon tube), a resistance pressure sensor (such as the pressure measuring sensor of slide wire resistance on the Bourdon tube), an analog pressure sensor and a digital pressure sensor. The pressure is collected via the pressure sensor, the pressure transmitter and various pressure sensing elements, such as the diffusion silicon type, sapphire type, piezoelectric type and strain gauge type (resistance strain gauge type and ceramic strain gauge type).

Among them, the temperature transducer 3 can be thermocouple, thermistor and semiconductor type; a contact/non-contact sensor, or a thermal resistance and thermocouple. In short, the temperature transducer, the temperature transmitter and various temperature sensing elements can be used for the temperature collection.

Among them, the control of valve 4 can be subject to various transmission modes, such as manual, electric, hydraulic, pneumatic, turbine, electromagnetic, electromagnetic, electro-hydraulic, pneumatic-hydraulic, spur gear and bevel gear drive. Under the action of pressure, temperature or other forms of sensing signals, the valve can act according to predetermined requirements, or simply open or close without relying on sensing signals. The valve relies on drive or automatic mechanism to enable the discs to move up and down, slide, swing or rotate, thus changing the size of its flow area to realize its control function. The valve 4 may be an automatic valve, a power-driven valve and a manual valve according to a drive mode. The automatic valve may include: an electromagnetic drive valve, an electromagnetic-hydraulic drive valve, an electro-hydraulic drive valve, a turbine drive valve, a spur gear drive valve, a bevel gear drive valve, a pneumatic drive valve, a hydraulic drive valve, a gas-hydraulic drive valve, a valve with an electrically motorized operation, and an electric motor (motor) drive valve. The valve 4 may be automatic, manual or semi-automatic. A check process may be completed automatically or semi-automatically through manual cooperation. The valve 4 is directly or indirectly connected to the electrical equipment 8 via a self-sealing valve, the manual valve, or a non-removable valve, and connected integrally or separately. Valve 4 can be of normally open, normally closed, one-way or two-way type as required. In a word, the gas path can be opened or closed by electric control valves, which can be solenoid valves, electric ball valves, valve with electrically motorized operations, electric proportional valves and so on.

The pressure regulating mechanism 5 in this embodiment is a cavity with an opening at one end. The cavity has a piston 51 therein. The piston 51 is provided with a sealing ring 510. One end of the piston 51 is connected to a regulating rod. The outer end of the regulating rod is connected to a drive part 52. The other end of the piston 51 extends into the opening and is in contact with the inner wall of the cavity. The drive part 52 drives the regulating rod and then drives the piston 51 to move in the cavity. The drive part 52 includes but is not limited to, one of a magnetic force, an electric motor (an inverter electric motor or a stepping electric motor), a reciprocating motion mechanism, a Carnot cycle mechanism, and a pneumatic element.

The online check contact signal sampling unit 6 mainly carries out the contact signal sampling of the gas density relay 1. That is, the basic requirements or functions of the online check contact signal sampling unit 6 are as follows: 1) it will not affect the safe operation of electrical equipment during check, that is, when the contact signal of gas density relay 1 acts during check, it will not affect the safe operation of electrical equipment; 2) The contact signal control loop of the gas density delay 1 does not affect the performance of the gas density relay body, especially the performance of the intelligent control unit 7. It will neither damage the gas density relay nor affect the test.

The basic requirements or functions of the intelligent control unit 7 are as below: The intelligent control unit 7 is used to control the valve 4 and the pressure regulating mechanism 5, and acquire signals. Implementation: The pressure value and temperature value when the contact signal of the gas density relay 1 acts can be detected and converted into the corresponding pressure value $P_{20}$ (density value) at 20° C., that is, the contact action value $P_{D20}$ of the gas density relay 1 can be detected, and the check of the gas density relay 1 can be performed. Alternatively, when the contact signal of the gas density relay 1 acts, the density value $P_{D20}$ may be detected directly, so as to complete the check of the gas density relay 1.

Of course, the intelligent control unit 7 can also realize: storing test data; and/or exporting the test data; and/or printing the test data; and/or data communication with an upper computer; and/or inputting analog and digital information. The intelligent control unit 7 may also consist of a communication module through which long-distance transmission of test data and/or check results can be achieved. When the rated pressure value of the gas density relay 1 outputs the signal, the intelligent control unit 7 collects the density value at the same time and completes the check of the rated pressure value of the gas density relay 1.

The electrical equipment includes SF6 gas electrical equipment, SF6 mixed gas electrical equipment, environmental protection gas electrical equipment, or other insulating gas electrical equipment. Specifically, the electrical equipment includes GIS, GIL, PASS, a circuit breaker, a current transformer, a voltage transformer, a transformer, an inflatable cabinet and a ring main unit, etc.

The electrical system has the functions of pressure and temperature measurement and software conversion. On the premise that the safe operation of the electrical equipment 8 is not affected, an action value and/or a return value of the alarm and/or a blocking contact of the gas density relay 1 may be detected online. Of course, the return value of alarm and/or blocking contact signal can also be tested as required.

When the electrical system performs the check of the gas density relay, it will automatically conduct mutual comparison and determination and gives an anomaly prompt that there is a problem with the gas density relay, pressure sensor and temperature transducer if the error is too high. That is, the electrical system can perform the mutual check function between gas density relay and pressure sensor, temperature transducer or density transmitter, and has the ability of artificial intelligence proofreading; after the check work is completed, the check report can be automatically generated, and if there is any abnormality, it can automatically send an alarm or send it to a designated receiver, such as a mobile phone; the gas density values and check results can be displayed on the spot, or displayed in the background. The specific method can be flexibly selected according to actual situation. It offers the functions of real-time online data display of gas density value, pressure value, temperature value, change trend analysis, historical data query, real-time alarm, etc. The gas density value, or gas density value, pressure value and temperature value can be monitored online; with self-diagnosis function, it can give timely notice of abnormalities, such as disconnection, short-circuit alarm and sensor damage. The error performance of the electrical system can be compared according to different temperatures and different time periods. That is, the electrical system compares the error performance of the electrical system in different periods and within the same temperature range to determine the performance of the electrical system. Specifically, comparison of various periods and comparison of history and present. It can determine, analyze and compare the gas density value, gas density relay 1, pressure sensor 2 and temperature transducer 3 of electrical equipment 8 for normality or abnormality. It also contains an analysis system (expert management analysis system) to detect, analyze and determine the gas density monitoring, gas density relay and monitoring elements, so as to know where the problem lies. the system can also monitor the contact signal state of gas density relay 1 and transmit its state remotely. The open or closed contact signal state of gas density relay 1 can be known in the background, so as to have more monitoring and improve reliability; the system can also detect and determine the temperature compensation performance of gas density relay 1 and the contact resistance of the gas density relay 1; it has the functions of data analysis and data processing, allowing it to perform corresponding fault diagnosis and prediction for electrical equipment 8.

As long as the test data of the pressure sensor 2, the temperature transducer 3 and the gas density relay 1 are consistent and normal, it shows that the electrical system is normal, and it is not necessary to check the gas density relay or other devices, and the system can be exempt from check for the full life. Only if the test data of the pressure sensor 2, the temperature transducer 3 and the gas density relay 1 are not consistent or normal, a maintenance man is arranged to deal with the test data. There is no need to check under matching and normal conditions, which would greatly improve the reliability and the work efficiency and reduces the O&M cost.

Embodiment II

Figure 3:
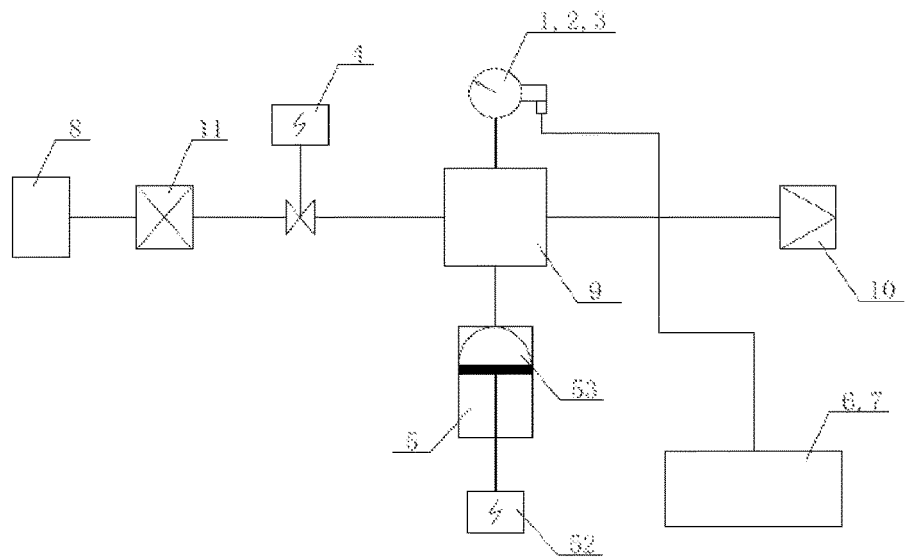
FIG. 3 is structural diagram of electrical system with online sampling check function of embodiment 2.

As shown in FIG. 3, the electrical system with online sampling and check function provided in Embodiment 2 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9, air admission interface 10, and self-sealing valve 11. One end of the self-sealing valve 11 is hermetically connected to the electrical equipment 8, and the other end is connected to valve 4; the gas inlet of the valve 4 is hermetically connected to the self-sealing valve 11, and the gas outlet is connected to the multichannel joint 9. The gas density relay 1 is installed on the multichannel joint 9. The pressure sensor 2 and the temperature transducer 3 are arranged on the gas density relay 1, and the pressure sensor 2 is connected to the gas density relay 1 over the gas path; the pressure regulating mechanism 5 is installed on the multichannel joint 9 and connected with the gas path of the gas density relay 1; the online check contact signal sampling unit 6 and intelligent control unit 7 are set together. The pressure sensor 2, temperature transducer 3, valve 4 and pressure regulating mechanism 5 are respectively connected with the intelligent control unit 7. The air admission interface 10 is connected with the multichannel joint 9.

Different from Embodiment 1, the pressure regulating mechanism 5 in this embodiment mainly consists of airbag 53 and drive part 52. The pressure regulating mechanism 5 makes the drive part 52 drive the airbag 53 under the control of the intelligent control unit 7, so that the volume of the airbag changes, thus completing pressure rise and fall. The pressure is regulated by the pressure regulating mechanism 5 to enable the contact action of the gas density relay 1. The contact action is transmitted to the intelligent control unit 7 through the online check contact signal sampling unit 6. The intelligent control unit 7 detects the alarm and/or blocking contact signal operating value and/or return value of the gas density relay 1 according to the pressure value and temperature value of gas density relay 1 at the time of contact action which are converted to the corresponding gas density values, thus completing the check of the gas density relay 1.

Embodiment III

Figure 4:
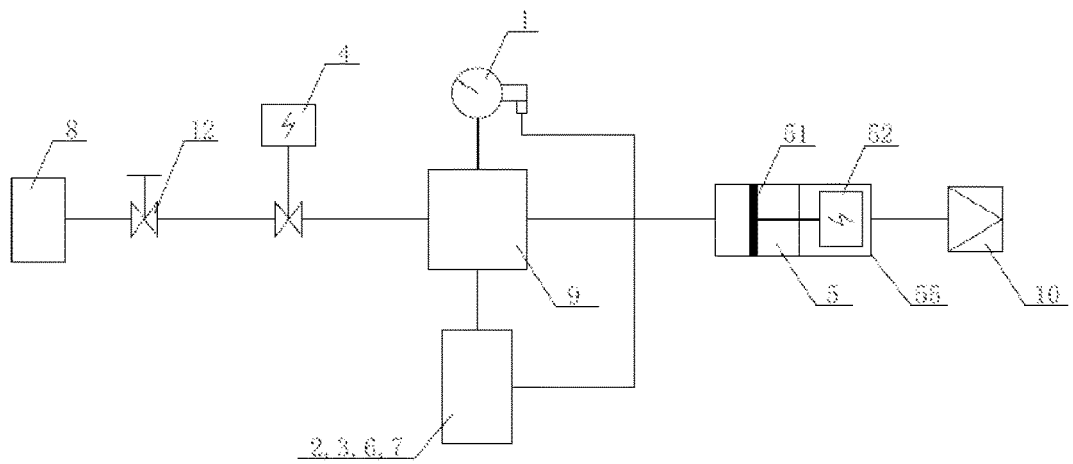
FIG. 4 is structural diagram of electrical system with online sampling check function of embodiment 3.

As shown in FIG. 4, the electrical system with online sampling and check function provided in Embodiment 3 of the invention includes gas density relay 1, pressure sensor 2, temperature transducer 3, valve with electrically motorized operation 4, pressure regulating mechanism 5, online check contact signal sampling unit 6, intelligent control unit 7, electrical equipment 8, multichannel joint 9, air admission interface 10, and valve 12. One end of the valve 12 is hermetically connected to the electrical equipment 8, and the other end is connected to the valve 4; the gas inlet of valve 4 is hermetically connected to the valve 12, and the gas outlet is connected to the multichannel joint 9. The gas density relay 1 is installed on the multichannel joint 9. The pressure sensor 2, the temperature transducer 3, the online check contact signal sampling unit 6 and the intelligent control unit 7 are arranged together. The pressure regulating mechanism 5 is installed on the multichannel joint 9, and the pressure sensor 2 is connected to the gas density relay 1 through the multichannel joint 9 over the gas path. The air supply joint 10 is arranged on the pressure regulating mechanism 5. The pressure sensor 2, temperature transducer 3, valve 4 and pressure regulating mechanism 5 are respectively connected with the intelligent control unit 7.

Different from the Embodiment 1, the pressure sensor 2, temperature transducer 3, online check contact signal sampling unit 6 and intelligent control unit 7 are arranged together.

Embodiment IV

Figure 5:
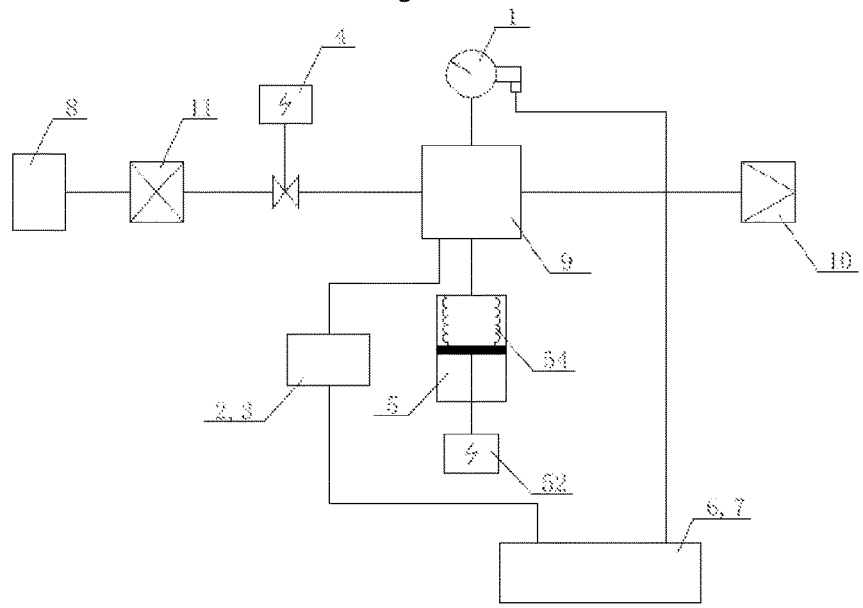
FIG. 5 is structural diagram of electrical system with online sampling check function of embodiment 4.

As shown in FIG. 5, the electrical system with online sampling and check function provided in Embodiment 4 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9, air admission interface 10, and self-sealing valve 11. One end of the self-sealing valve 11 is hermetically connected to the electrical equipment 8, and the other end is connected to the gas inlet of valve 4; the gas outlet of the valve 4 is connected to the gas density relay 1, the pressure sensor 2, the pressure regulating mechanism 5 and the air admission interface 10 through the multichannel joint 9 over the gas path. The pressure sensor 2 and the temperature transducer 3 are arranged together to form a gas density transmitter, which directly obtains a gas density value, a pressure value, and a temperature value. The pressure regulating mechanism 5 communicates with the gas density relay 1 via the multichannel joint 9. The online check contact signal sampling unit 6 and the intelligent control unit 7 are arranged together. The pressure sensor 2 and temperature transducer 3 are directly or indirectly connected with the intelligent control unit 7. The valve 4 is connected with the intelligent control unit 7. The pressure regulating mechanism 5 is connected with the intelligent control unit 7.

The difference from embodiment I is as follows:

1) The pressure regulating mechanism 5 in this embodiment mainly consists of bellows 54 and drive part 52. The bellows 54 is hermetically connected with the gas density relay 1 to form a reliable sealed cavity. The pressure regulating mechanism 5 makes the drive part 52 drive the volume of bellows 54 to change under the control of the intelligent control unit 7 so that the volume of the seal cavity changes, thus performing pressure regulation.

2) The pressure sensor 2 and the temperature transducer 3 are arranged together to form a gas density transmitter, which can directly obtain the gas density value, the pressure value, and the temperature value. The pressure is regulated by the pressure regulating mechanism 5 to enable the contact action of the gas density relay 1. The contact action is transmitted to the intelligent control unit 7 through the online check contact signal sampling unit 6. The intelligent control unit 7 detects the alarm and/or blocking contact signal operating value and/or return value of the gas density relay according to the density value, or even the pressure value and temperature value of gas density relay 1 at the time of contact action, thus completing the check of the gas density relay. Alternatively, the intelligent control unit 7 only detects the alarm and/or the blocking contact action value of the gas density relay 1 so as to complete the check of the gas density relay 1.

Embodiment V

Figure 6:
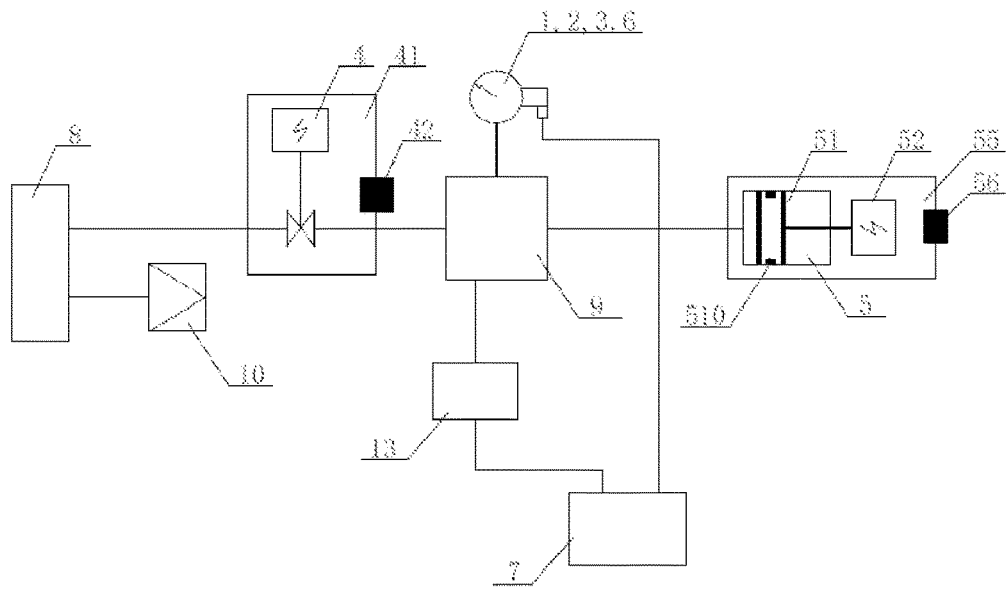
FIG. 6 is structural diagram of electrical system with online sampling check function of embodiment 5.

As shown in FIG. 6, the electrical system with online sampling and check function provided in Embodiment 5 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9 and air admission interface 10. The gas inlet of valve 4 is connected to the electrical equipment 8, and the gas outlet of valve 4 is connected with the multichannel joint 9. The valve 4 is sealed in the first housing 41, and the control cable of valve 4 is led out through the first lead seal 42 which is sealed with the first housing 41. Such design ensues that the valve 4 keeps sealed and operates reliably for a long term. The air admission interface 10 is directly arranged on the electrical equipment 8, and can be used for air supply or micro-water test on the electrical equipment 8. The gas density relay 1 is installed on the multichannel joint 9. The pressure sensor 2, the temperature transducer 3, the online check contact signal sampling unit 6 and the gas density relay 1 are arranged together. The pressure sensor 2 is connected to the gas density relay 1 over the gas path; the pressure regulating mechanism 5 is installed on the multichannel joint 9 and connected to the gas density relay 1 over the gas path; the pressure regulating mechanism 5 is sealed in the second housing 55, and the control cable of pressure regulating mechanism 5 is led out through the second lead seal 56 which is sealed with the second housing 55. Such design ensues that the pressure regulating mechanism 5 is reliably sealed and can operate for a long time. The pressure sensor 2 and temperature transducer 3 are connected with the intelligent control unit 7. The valve 4 is connected with the intelligent control unit 7. The pressure regulating mechanism 5 is connected with the intelligent control unit 7.

Different from the Embodiment 1, 1) the valve 4 and the pressure regulating mechanism 5 are sealed inside their housings respectively. 2) The pressure sensor 2, the temperature transducer 3, the online check contact signal sampling unit 6 and the gas density relay 1 are arranged together. 3) It also contains a moisture sensor 13, one end of which is connected with the multichannel joint 9 and the other end of which is connected with the intelligent control unit 7, which can monitor the moisture content in the air chamber of the electrical equipment 8, and can accurately monitor the moisture content in the air chamber in combination with the circulation of the gas by the pressure regulating mechanism 5. 4) The air admission interface 10 is directly arranged on the electrical equipment 8.

Embodiment VI

Figure 7:
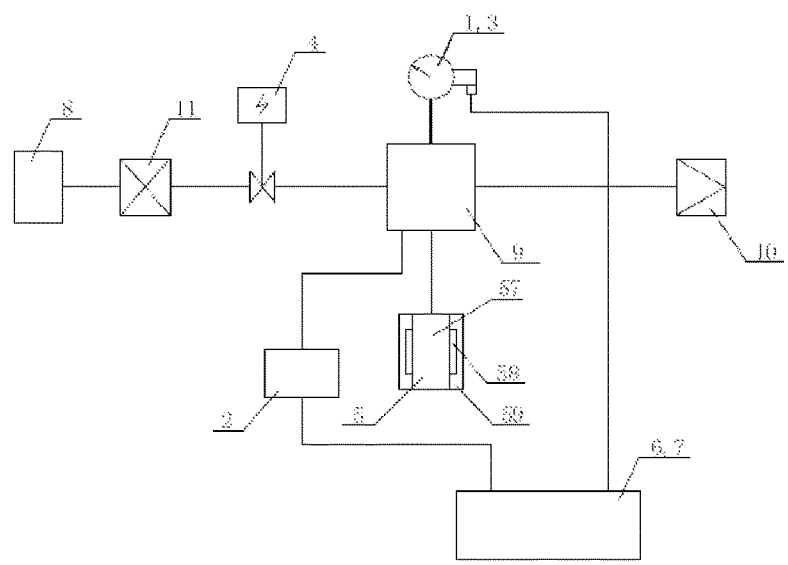
FIG. 7 is a structural schematic diagram of the electrical system with online sampling and check function in Embodiment 6.

As shown in FIG. 7, the electrical system with online sampling and check function provided in Embodiment 6 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9, air admission interface 10, and self-sealing valve 11. One end of the self-sealing valve 11 is hermetically connected to the electrical equipment 8, and the other end is connected to valve 4; the gas inlet of valve 4 is hermetically connected to the self-sealing valve 11, and the gas outlet is connected to the multichannel joint 9. The gas density relay 1 is installed on the multichannel joint 9. The pressure sensor 2 is installed on the multichannel joint 9. The pressure sensor 2 is connected with the gas density relay 1 over the gas path. The pressure regulating mechanism 5 is installed on the multichannel joint 9 and connected to the gas density relay 1; the online check contact signal sampling unit 6 and intelligent control unit 7 are set together; the temperature transducer 3 is arranged inside the housing of the gas density relay 1 as an accessory of the temperature compensation element. The pressure sensor 2 and temperature transducer 3 are connected with the intelligent control unit 7. The valve 4 is connected with the intelligent control unit 7. The pressure regulating mechanism 5 is connected with the intelligent control unit 7. The air admission interface 10 communicates with the multichannel joint 9.

Obviously different from the Embodiment 1, the pressure regulating mechanism 5 in this embodiment mainly consists of air chamber 57, heating element 58 and heat insulation element 59. The heating element 58 is installed outside (or inside) the air chamber 57, and temperature change arises from heating by the heating element 58 to complete pressure rise and fall. The pressure is regulated by the pressure regulating mechanism 5 to enable the contact action of the gas density relay 1. The contact action is transmitted to the intelligent control unit 7 through the online check contact signal sampling unit 6. The intelligent control unit 7 detects the alarm and/or blocking contact signal operating value and/or return value of the gas density relay according to the pressure value and temperature value of gas density relay 1 at the time of contact action which are converted to the corresponding gas density values, thus completing the check of the gas density relay.

The working principle of this embodiment is as below: When the density relay needs a check, the intelligent control unit 7 controls the heating element 58 of the pressure regulating mechanism 5 to heat. When the temperature difference between the temperature value of the pressure regulating mechanism 5 and that of the temperature transducer 3 reaches the set value, the valve 4 can be closed through the intelligent control unit 7 so that the gas density relay 1 is disconnected from the electrical equipment 8 over the gas path. Then, the heating element 58 of the regulator 5 is cut off immediately to stop heating of the heating element 58. Then, gas pressure of the airtight air chamber 57 of the pressure regulating mechanism 5 gradually drops so that the alarm and/or blocking contact of gas density relay 1 acts respectively. The contact action is transmitted to the intelligent control unit 7 through the online check contact signal sampling unit 6. The intelligent control unit 7 detects the alarm and/or blocking contact signal operating value and/or return value of the gas density relay according to the density value at the time of alarm and/or blocking contact action, thus completing the check of the gas density relay.

Embodiment VII

Figure 8:
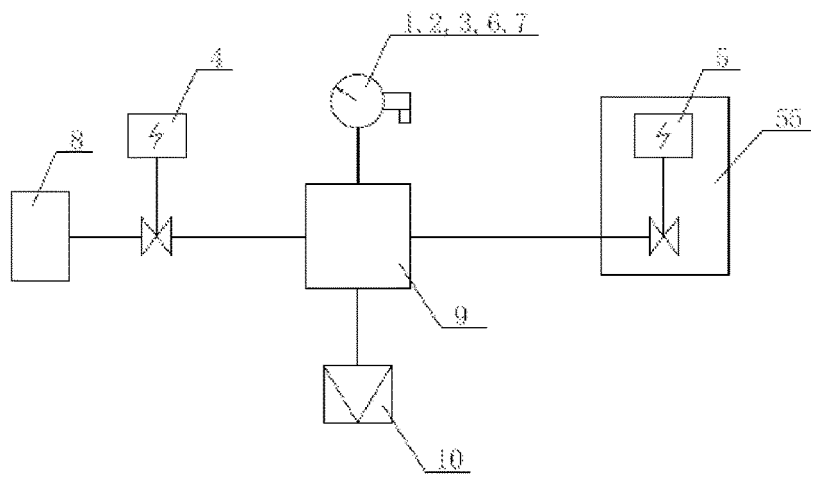
FIG. 8 is a structural schematic diagram of the electrical system with online sampling and check function in Embodiment 7.

As shown in FIG. 8, the electrical system with online sampling and check function provided in Embodiment 7 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9 and air admission interface 10. The gas inlet of valve 4 is connected to the electrical equipment 8, and the gas outlet of valve 4 is connected with the multichannel joint 9. The gas density relay 1 is installed on the multichannel joint 9. The pressure sensor 2, temperature transducer 3, online check contact signal sampling unit 6, and intelligent control unit 7 are arranged on the gas density relay 1. The pressure sensor 2 is connected to the gas density relay 1 over the gas path; the pressure regulating mechanism 5 is installed on the multichannel joint 9 and connected to the gas density relay 1. The pressure sensor 2, temperature transducer 3, valve 4 and pressure regulating mechanism 5 are respectively connected with the intelligent control unit 7.

Different from the Embodiment 1, the pressure regulating mechanism 5 of this embodiment mainly consists of a solenoid valve and a second housing 55. The pressure regulating mechanism 5 makes the solenoid valve open under the control of the intelligent control unit 7 so that the pressure changes to complete pressure rise and fall. The pressure is regulated by the pressure regulating mechanism 5 (solenoid valve) to enable the contact action of the gas density relay 1. The contact action is transmitted to the intelligent control unit 7 through the online check contact signal sampling unit 6. The intelligent control unit 7 detects the alarm and/or blocking contact signal operating value of the gas density relay 1 according to the pressure value and temperature value of gas density relay 1 at the time of contact action which are converted to the corresponding gas density values. After the check of the contact action value of the gas density relay 1 is completed, the intelligent control unit 7 closes the solenoid valve 5, then opens the valve 4, so as to change the pressure, thus completing the pressure rise, so as to enable the contact reset of the gas density relay 1. The contact reset is transmitted to the intelligent control unit 7 through the online check contact signal sampling unit 6, where the intelligent control unit 7 converts the pressure value and temperature value of the contact reset (disengage) of the gas density relay 1 into the corresponding density value, and detects the alarm and/or blocking contact return value of gas density relay 1, thus completing the check of gas density relay 1.

Embodiment VIII

Figure 9:
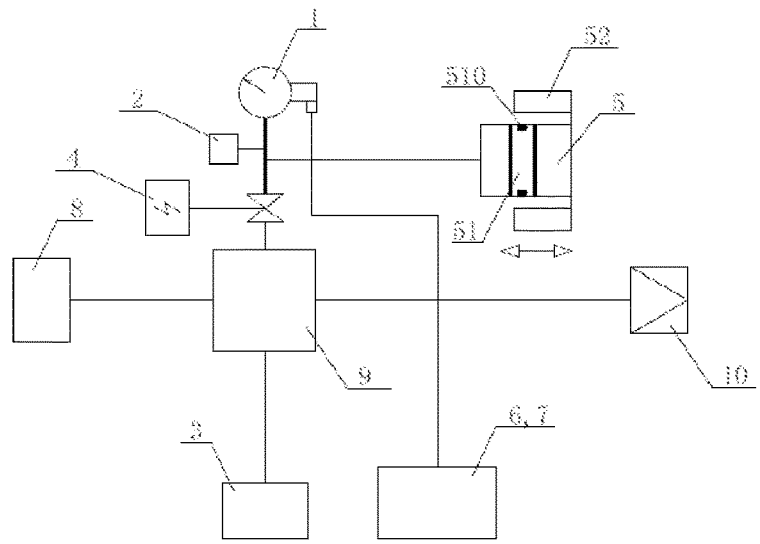
FIG. 9 is a structural schematic diagram of the electrical system with online sampling and check function in Embodiment 8.

As shown in FIG. 9, the electrical system with online sampling and check function provided in Embodiment 8 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9 and air admission interface 10. The interface between the valve 4 and electrical equipment 8 is connected to the first connector of the multichannel joint 9; the gas density relay 1 is connected with multichannel joint 9 through valve 4; the second connector of multichannel joint 9 is used to connect the electrical equipment. The air admission interface 10 and the temperature transducer 3 are respectively installed on the multichannel joint 9.

Different from Embodiment 1, the pressure regulating mechanism 5 in this embodiment mainly consists of piston 51 and drive part 52. One end of piston 51 is connected with the gas density relay 1 in a sealed manner, forming a reliable seal cavity. The pressure regulating mechanism 5 makes the drive part 52 drive the piston 51 to move under the control of the intelligent control unit 7, so that the volume of the seal cavity changes, thus completing pressure rise and fall. The drive part 52 is set outside the seal cavity, while the piston 51 is set inside the seal cavity. The drive part 52 drives the piston 51 to move through electromagnetic force.

Embodiment IX

Figure 10:
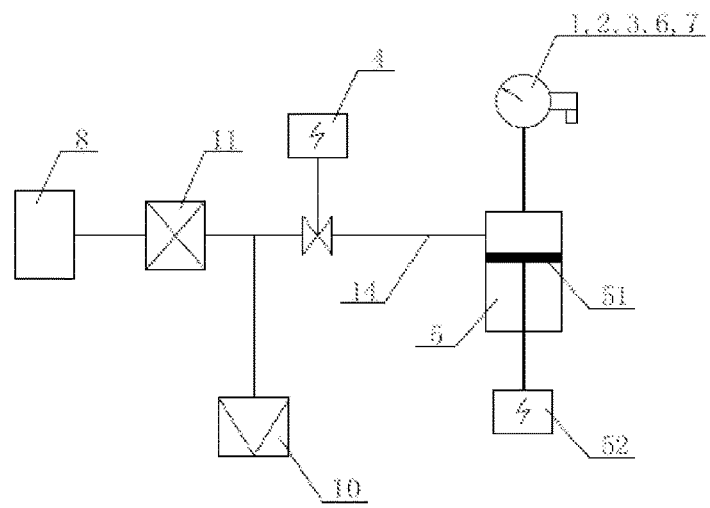
FIG. 10 is a structural schematic diagram of the electrical system with online sampling and check function in Embodiment 9.

As shown in FIG. 10, the electrical system with online sampling and check function provided in Embodiment 9 of the invention includes gas density relay 1, pressure sensor 2, temperature transducer 3, valve 4, pressure regulating mechanism 5, online check contact signal sampling unit 6, intelligent control unit 7, electrical equipment 8, air admission interface 10, and self-sealing valve 11. One end of the self-sealing valve 11 is connected to the electrical equipment 8 in a sealed manner, while the other end of the self-sealing valve 11 is connected with the air admission interface 10 and the gas inlet of valve 4. The gas outlet of valve 4 is connected with the gas path of pressure regulating mechanism 5 through joint pipe 14, so that the valve 4 will be connected with the gas density relay 1.

Different from Embodiment 1, the pressure sensor 2, temperature transducer 3, online check contact signal sampling unit 6, intelligent control unit 7 and the gas density relay 1 are set together; the gas density relay 1 is set on the pressure regulating mechanism 5.

Embodiment X

Figure 11:
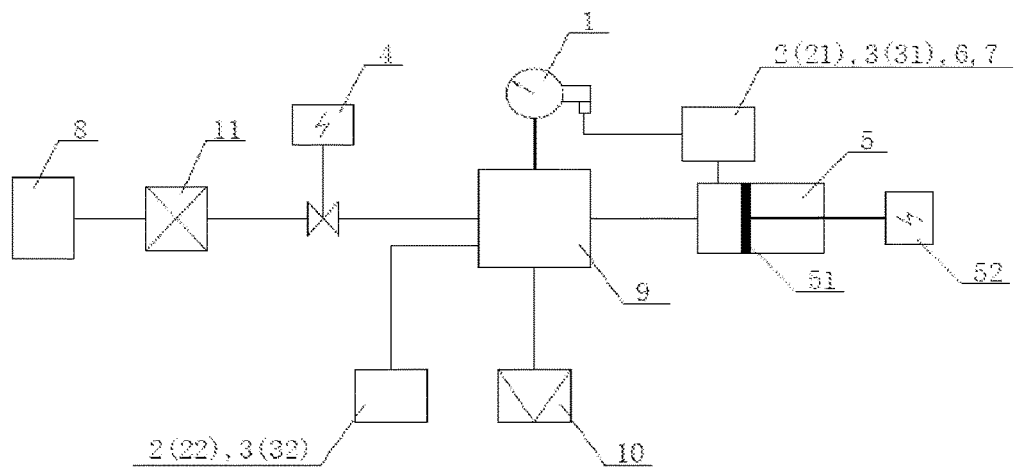
FIG. 11 is a structural schematic diagram of the electrical system with online sampling and check function in Embodiment 10.

As shown in FIG. 11, the electrical system with online sampling and check function provided in Embodiment 10 of the invention includes gas density relay 1, the first pressure sensor 21, the second pressure sensor 22, the first temperature transducer 31, the second temperature transducer 32, valve 4, pressure regulating mechanism 5, online check contact signal sampling unit 6, intelligent control unit 7, electrical equipment 8, multichannel joint 9, air admission interface 10, and self-sealing valve 11. One end of the self-sealing valve 11 is hermetically connected to the electrical equipment 8, and the other end is connected to the gas inlet of valve 4; the gas outlet of valve 4 is connected with the multichannel joint 9. The gas density relay 1, the second pressure sensor 22, the second temperature transducer 32, pressure regulating mechanism 5 and air admission interface 10 are set on the multichannel joint 9; the first pressure sensor 21 and the first temperature transducer 31 are set on the pressure regulating mechanism 5. The first pressure sensor 21, the second pressure sensor 22, the first temperature transducer 31 and the second temperature transducer 32 are respectively connected with the intelligent control unit 7. The first pressure sensor 21, the second pressure sensor 22 and the gas density relay 1 are connected with the pressure regulating mechanism 5 on the gas path; the valve 4 is connected with the intelligent control unit 7. The pressure regulating mechanism 5 is connected with the intelligent control unit 7.

Different from the embodiment I, there are two pressure sensors, which are the first pressure sensor 21 and the second pressure sensor 22, and there are two temperature transducers, which are the first temperature transducer 31 and the second temperature transducer 32 This embodiment provides a plurality of pressure sensors and temperature transducers for the following purpose: pressure values obtained by monitoring the first pressure sensor 21 and the second pressure sensor 22 may be compared and mutually checked.

Temperature values obtained by monitoring the first temperature transducer 31 and the second temperature transducer 32 may be compared and mutually checked. A density value $P1_{20}$ obtained by monitoring the first pressure sensor 21 and the first temperature transducer 31 and a density value $P2_{20}$ obtained by monitoring the second pressure sensor 22 and the second temperature transducer 32 are compared and checked mutually. Even a density value Pen of a rated value of the gas density relay 1 may be obtained through online check. Mutual comparison and mutual check are performed.

Embodiment XI

Figure 12:
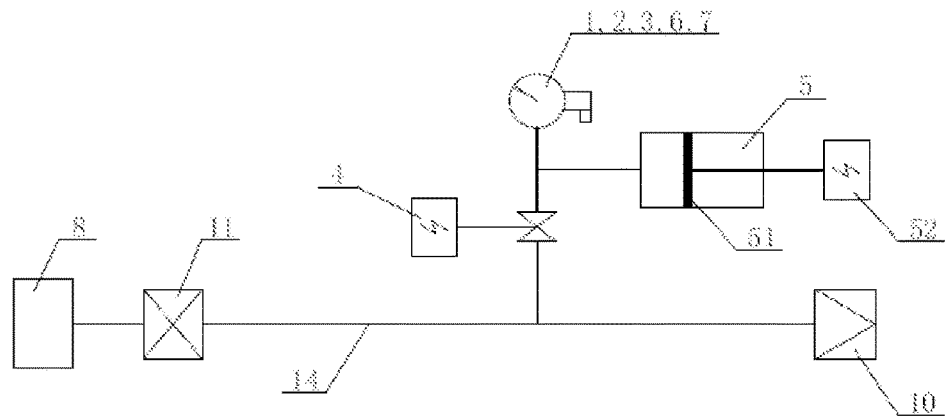
FIG. 12 is a structural schematic diagram of the electrical system with online sampling and check function in Embodiment 11.

As shown in FIG. 12, the electrical system with online sampling and check function provided in Embodiment 11 of the invention includes gas density relay 1, pressure sensor 2, temperature transducer 3, valve 4, pressure regulating mechanism 5, online check contact signal sampling unit 6, intelligent control unit 7, electrical equipment 8, air admission interface 10, and self-sealing valve 11. One end of the self-sealing valve 11 is connected to the electrical equipment 8 in a sealed manner, while the other end of the self-sealing valve 11 is connected with the gas inlet of valve 4 and the air admission interface 10 through connecting pipes. The gas outlet of valve 4 is connected with the gas density relay 1. The pressure sensor 2, temperature transducer 3, online check contact signal sampling unit 6 and intelligent control unit 7 are installed on or in the housing of the gas density relay 1. The pressure sensor 2 is connected with the gas density relay 1 on the gas path; the pressure regulating mechanism 5 is connected with the gas density relay 1; the online check contact signal sampling unit 6 and intelligent control unit 7 are set together. The pressure sensor 2, temperature transducer 3, valve 4 and the pressure regulating mechanism 5 are respectively connected with the intelligent control unit 7.

Embodiment 12

Figure 13:
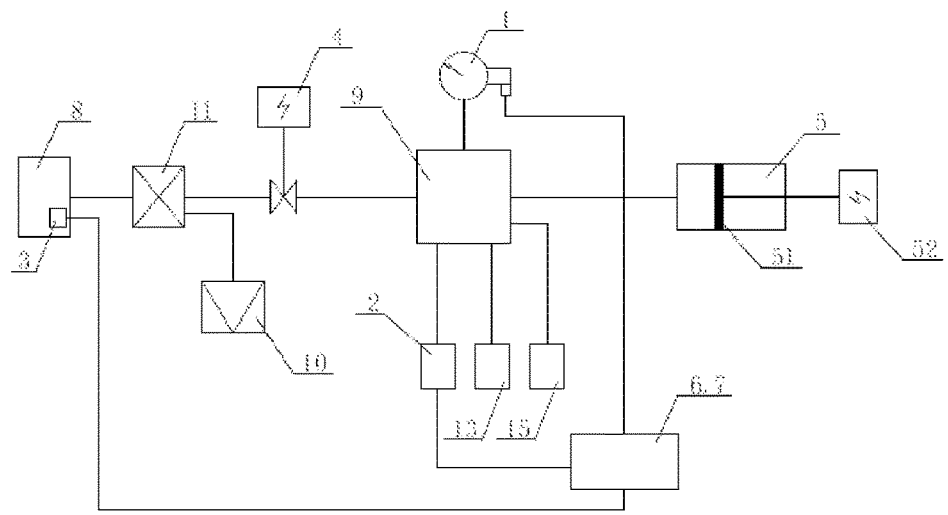
FIG. 13 is a structural schematic diagram of the electrical system with online sampling and check function in Embodiment 12.

As shown in FIG. 13, the electrical system with online sampling and check function provided in Embodiment 12 of the invention includes gas density relay 1, pressure sensor 2, temperature transducer 3, valve 4, pressure regulating mechanism 5, online check contact signal sampling unit 6, intelligent control unit 7, electrical equipment 8, multichannel joint 9, air admission interface 10, self-sealing valve 11, moisture sensor 13, and decomposition product sensor 15. One end of the self-sealing valve 11 is connected to the electrical equipment 8 in a sealed manner, the other end of the self-sealing valve 11 is connected with the gas inlet of valve 4, and the air admission interface 10 is connected with the self-sealing valve 11; the gas outlet of valve 4 is connected with the multichannel joint 9. The gas density relay 1, pressure sensor 2, pressure regulating mechanism 5, moisture sensor 13 and decomposition product sensor 15 are set on the multichannel joint 9; the temperature transducer 3 is installed on the electrical equipment 8. The online check contact signal sampling unit 6 and intelligent control unit 7 are set together. The pressure sensor 2, temperature transducer 3, moisture sensor 13, and decomposition product sensor 15 are connected with the intelligent control unit 7. The pressure sensor 2 and the gas density relay 1 are connected with the pressure regulating mechanism 5 on the gas path; the valve 4 is connected with the intelligent control unit 7. The pressure regulating mechanism 5 is connected with the intelligent control unit 7.

Different from Embodiment 1, the temperature transducer 3 is set on the electrical equipment 8; it also consists of moisture sensor 13 monitoring the moisture content of electrical equipment 8 and decomposition product sensor 15 monitoring the decomposition product content.

Embodiment 13

Figure 14:
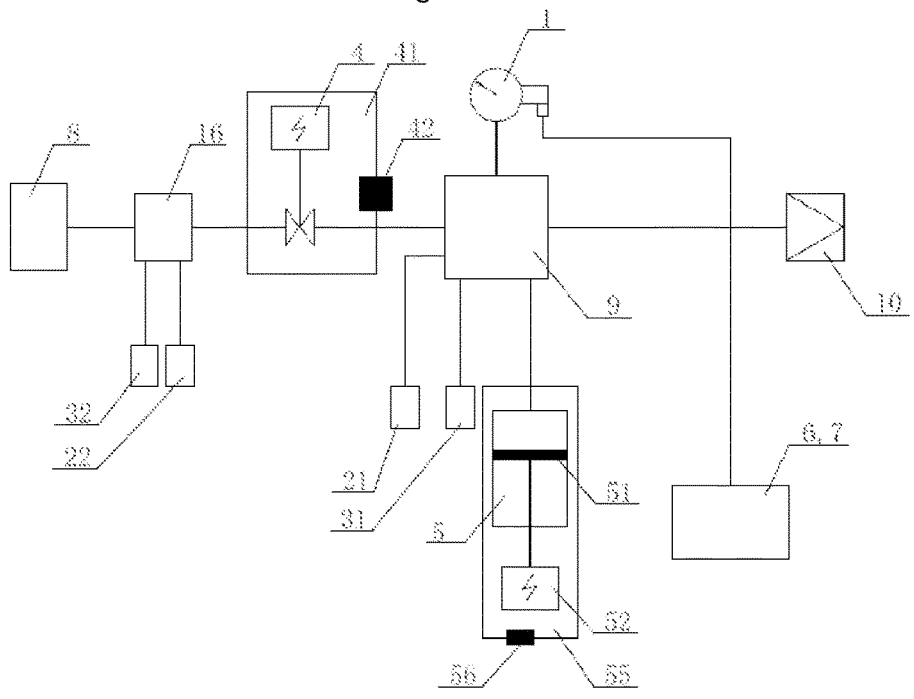
FIG. 14 is a schematic diagram of the control loop of the electrical system in Embodiment 13.
Figure 15:
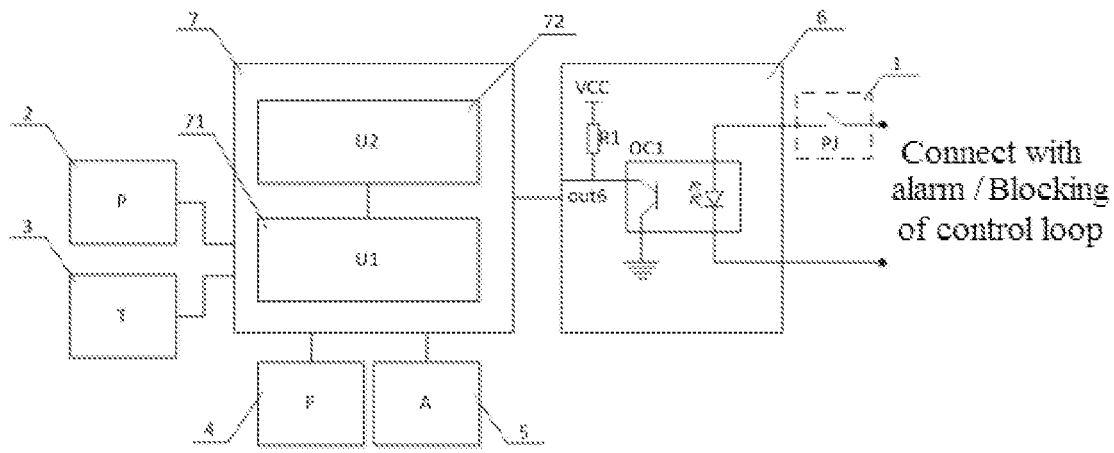
FIG. 15 is a schematic diagram of the control loop of the electrical system in Embodiment 14.

As shown in FIG. 14, the electrical system with online sampling and check function provided in Embodiment 13 of the invention includes gas density relay 1, the first pressure sensor 21, the second pressure sensor 22, the first temperature transducer 31, the second temperature transducer 32, valve 4, pressure regulating mechanism 5, online check contact signal sampling unit 6, intelligent control unit 7, electrical equipment 8, multichannel joint 9, air admission interface 10, and connector 16.

One end of the connector 16 is connected to the electrical equipment 8 in a sealed manner, while the other end of the connector 16 is connected with the gas inlet of valve 4; the gas outlet of the valve 4 is connected with the multichannel joint 9, the valve 4 is sealed in the first housing 41, and the control cable of valve 4 is led out through the first lead seal 42 which is sealed with the first housing 41. Such design ensues that the valve 4 keeps sealed and operates reliably for a long term. The gas density relay 1, the first pressure sensor 21, the first temperature transducer 31, pressure regulating mechanism 5 and air admission interface 10 are set on the multichannel joint 9. The pressure regulating mechanism 5 is sealed in the second housing 55, and the control cable of pressure regulating mechanism 5 is led out through the second lead seal 56 which is sealed with the second housing 55. Such design ensues that the pressure regulating mechanism 5 keeps sealed and operates reliably for a long term. The second pressure sensor 22 and the second temperature transducer 32 are set on the connector 16. The first pressure sensor 21, the second pressure sensor 22, the first temperature transducer 31 and the second temperature transducer 32 are connected with the intelligent control unit 7; the valve 4 is connected with the intelligent control unit 7. The pressure regulating mechanism 5 is connected with the intelligent control unit 7.

When the valve 4 is opening, the first pressure sensor 21, the second pressure sensor 22 and the gas density relay 1 are connected with the pressure regulating mechanism 5 on the gas path. However, when the valve 4 is closed, the first pressure sensor 21 and the gas density relay 1 are connected with the pressure regulating mechanism 5 on the gas path, while the second pressure sensor 22 and the gas density relay 1 are not connected with the pressure regulating mechanism 5 on the gas path.

Different from Embodiment 1, there are two pressure sensors, i.e. the first pressure sensor 21 and the second pressure sensor 22, respectively; there are two temperature transducers, i.e. the first temperature transducer 31 and the second temperature transducer 32, respectively. This embodiment is equipped with safety and protection function, i.e. 1) when the density values monitored by the first pressure sensor 21 and the first temperature transducer 31 or the second pressure sensor 22 and the second temperature transducer 32 are lower than the set value, the gas density relay will automatically terminate the check and give out the signals. For example, when the gas density value of the equipment is lower than the set value, no check will be conducted again; only when the gas density value of the equipment is equal to or greater than (the blocking pressure+ 0.02 MPa) can check be conducted. The status indicators are available for the contact alarms. 2) or if the valve 4 is closed at the time of check, and the density values monitored by the second pressure sensor 22 and the second temperature transducer 32 are lower than the set value, the gas density relay will automatically terminate the check and give out the signals (leakage). For example, when the gas density value of the equipment is lower than the set value (the blocking pressure+0.02 MPa), no check will be conducted again. The set value can be set at random as required. At the same time, the gas density relay can perform the mutual check for the plurality of pressure sensors and the temperature transducers and the mutual check for the sensors and the gas density relay, to ensure the normal work of the gas density relay. The pressure values monitored by the first pressure sensor 21 and the second pressure sensor 22 can be compared and checked mutually; the temperature values monitored by the first temperature transducer 31 and the second temperature transducer 32 can be compared and checked mutually; the density value P1$20$ monitored by the first pressure sensor 21 and the first temperature transducer 31 and the density value P2$_{20}$ monitored by the second pressure sensor 22 and the second temperature transducer 32 can be compared and checked mutually; in addition, the checked density value Pe$_{20}$ of rating of gas density relay 1 can be compared and checked mutually.

Embodiment 14

As shown in FIG. 7, an online check contact signal sampling unit is provided with a contact sampling circuit. In this embodiment, the contact sampling circuit includes a photocoupler OC1 and a resistor R1. The photocoupler includes a light-emitting diode and a phototriode. A positive electrode of the light-emitting diode is connected in series with a contact of a gas density relay to form a closed loop. An emitter of the phototriode is grounded. A collector of the phototriode is connected to an intelligent control unit as an output terminal out6 of the online check contact signal sampling unit 6. The collector of the phototriode is also connected to a power supply via the resistor.

With the above contact sampling circuit, it may be easily known whether the state of the contact P$_J$ of the gas density relay 1 is open or closed. Specifically, when the contact P$_J$ is closed, the closed loop is powered on, and the light-emitting diode emits light. The phototriode is turned on by the light. The collector of the phototriode outputs a lower level. When the contact P$_J$ is open, the closed loop is powered off, and the light-emitting diode does not emit light. The phototriode is turned off. The collector of the phototriode outputs a high level. The output terminal out6 of the online check contact signal sampling unit 6 outputs a high level and a lower level.

In this embodiment, the intelligent control unit 7 is isolated from the control loop of the contact signal via a method of photoelectric isolation. The contact PJ is closed during a check process, or the contact P$_J$ also is closed in the case of air leakage. At this time, the lower level output by the collector of the phototransistor is detected in both cases. The time of closing the contact P$_J$ during the check process is controlled to a preset period, so that the duration of the contact PJ in a closed state during the check process is determined in the case of non-air leakage. By monitoring the duration of the received low level, it may be determined whether the contact P$_J$ is closed during the check process. Therefore, it may be determined by recording the time during the check that the alarm signal issued by the gas density relay 1 is an alarm signal during the check, but not an alarm signal during gas leakage.

In this embodiment, the intelligent control unit 7 mainly consists of a processor 71(U1), and a power supply 72 (U2).

Embodiment 15

Figure 16:
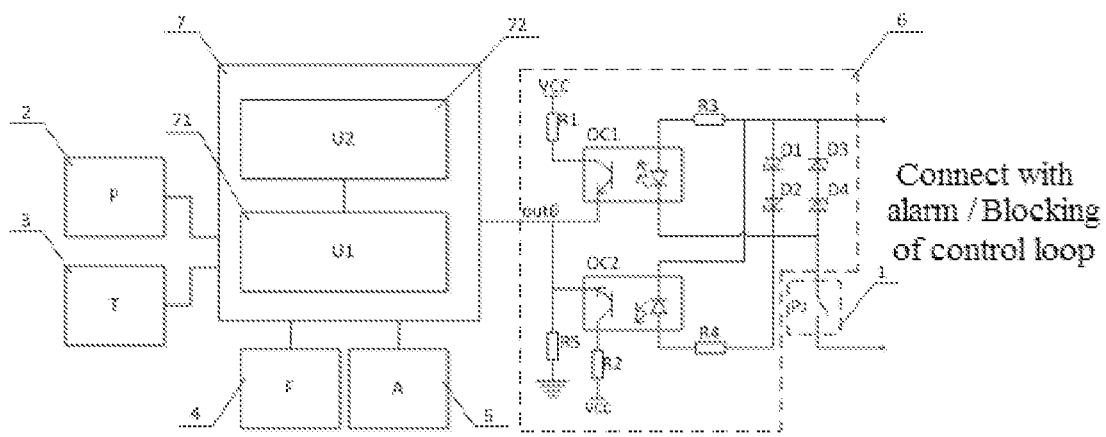
FIG. 16 is a schematic diagram of the control loop of the electrical system in Embodiment 15.

As shown in FIG. 16, an online check contact signal sampling unit is provided with a contact sampling circuit. In this embodiment, the contact sampling circuit includes a first photocoupler OC1, and a second photocoupler OC2.

A light-emitting diode of the first photocoupler OC1 and a light-emitting diode of the second photocoupler are connected in parallel via a current limiting resistor, and then are connected in series with a contact of a gas density relay to form a closed loop. The light-emitting diodes of the first photocoupler OC1 and the second photocoupler OC2 are connected in opposite directions. A collector of a phototriode of the first photocoupler OC1 and a collector of a phototriode of the second photocoupler OC2 are both connected to a power supply via a voltage dividing resistor. An emitter of the phototriode of the first photocoupler OC1 is connected to an emitter of the phototriode of the second optocoupler OC2 to form an output terminal out6. The output terminal out6 is connected to an intelligent control unit 7 and is grounded by a resistor R5.

With the above contact sampling circuit, it may be easily known whether the state of the contact P$_J$ of the gas density relay 1 is open or closed. Specifically, when a contact P$_J$ is closed, the closed loop is powered on. The first photocoupler OC1 is turned on. The second photocoupler OC2 is turned off. The emitter (i.e., the output terminal out6) of the phototriode of the first photocoupler outputs a high level. Alternatively, the first photocoupler is turned off. The second photocoupler is turned on. The emitter of the phototriode of the second photocoupler outputs a high level. When the contact P$_J$ is open, the closed loop is powered off. Both the first photocoupler and the second photocoupler are turned off. The emitters of the phototriodes of the first photocoupler and the second photocoupler output a low level.

In a preferable embodiment, a contact sampling circuit further includes a first Zener diode group, and a second Zener diode group. The first Zener diode group and the second Zener diode group are connected in parallel on a control loop of a contact signal. The first Zener diode group and the second Zener diode group are connected in opposite directions. The first Zener diode group and the second Zener diode group each consist of one, two or more Zener diodes connected in series.

In this embodiment, the first Zener diode group includes a first Zener diode D1 and a second Zener diode D2 connected in series. A negative electrode of the first Zener diode is connected to a positive electrode of the second Zener diode. The second Zener diode group includes a third Zener diode and a fourth Zener diode connected in series. A positive electrode of the third Zener diode is connected to a negative electrode of the fourth Zener diode.

The contact sampling circuit may easily monitor a state of the contact PJ of the gas density relay 1. Combined with the intelligent control unit 7, an open state or a closed state of the contact P$_J$ is correspondingly processed and remotely transmitted. The state of the contact signal is known from a background, greatly improving the reliability of a power grid.

In this embodiment, the intelligent control unit 7 mainly consists of a processor 71(U1), and a power supply 72 (U2).

Embodiment 16

Figure 17:
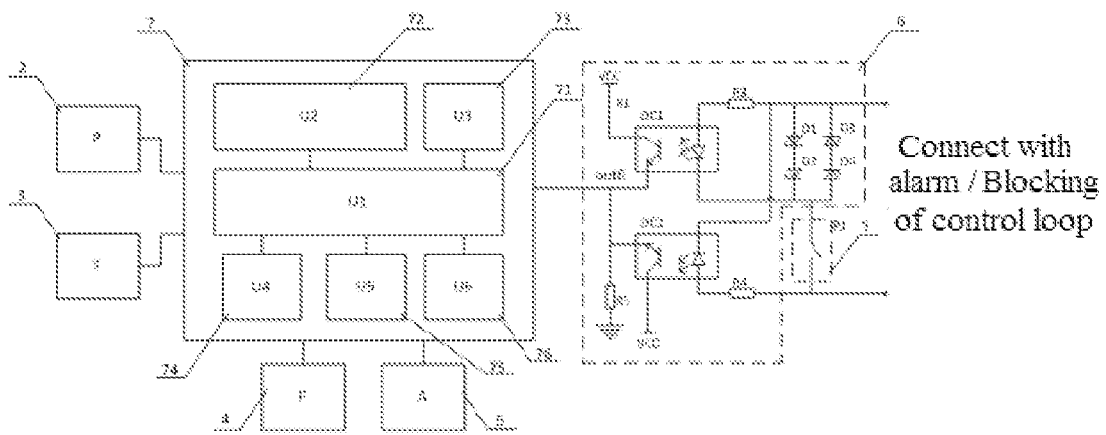
FIG. 17 is a schematic diagram of the control loop of the electrical system in Embodiment 16.

As shown in FIG. 17, the difference between this embodiment and Embodiment 15 is that: the intelligent control unit 7 mainly consists of a processor 71 (U1), a power supply 72 (U2), a communication module 73 (U3), an intelligent control unit protection circuit 74 (U4), display and output 75 (U5) and a data storage 76 (U6).

The communication way of the communication module may be wire, such as RS232, RS485, CAN-BUS and other industrial buses, an optical fiber ethernet, 4-20 mA, Hart, IIC, SPI, Wire, a coaxial cable, an PLC power line carrier, etc. The communication way of the communication module may be wireless, such as 2G/3G/4G/5G, WIFI, Bluetooth, Lora, Lorawan, Zigbee, infrared, ultrasonic, acoustic, satellite, light wave, quantum communication, sonar, etc. The intelligent control unit protection circuit 74 (U4) can be an anti-static interference circuit (such as ESD, EMI), an anti-surge circuit, an electrical fast protection circuit, an anti-radio frequency field interference circuit, an anti-burst interference circuit, a power supply short-circuit protection circuit, a power supply reverse-connection protection circuit, an electrical contact misconnection protection circuit, a charging protection circuit, etc. These intelligent control unit protection circuits can consist one or several flexible combinations. The display and output device 75 (U5) may be a digital tube, LED, LCD, HMI, a display, a matrix screen, a printer, a fax, a projector, a mobile phone, etc., one or a plurality of which may be combined flexibly. One or a plurality of flash memory cards such as FLASH, RAM, ROM, a hard disk, SD, etc., a magnetic tape, a punched paper tape, an optical disc, a U disc, a disc, a film roll, etc. may be combined to form the data storage device 76 (U6).

Embodiment 17

Figure 18:
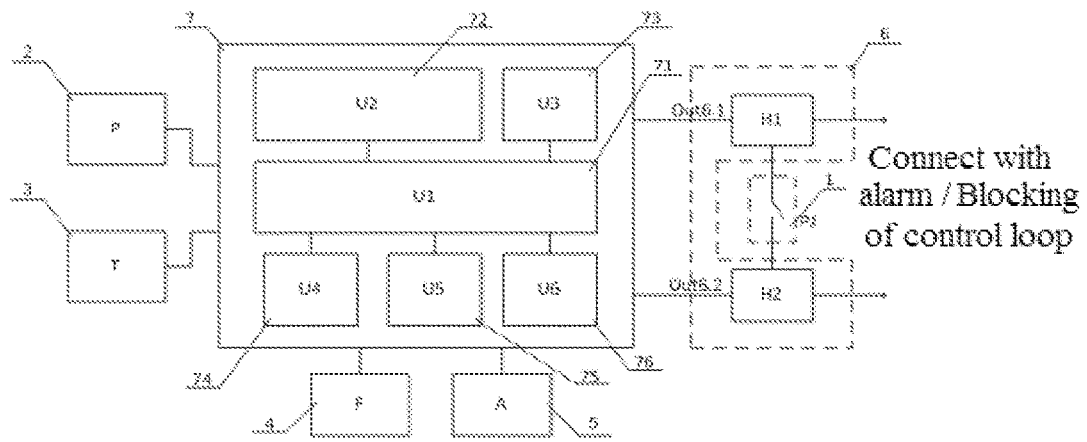
FIG. 18 is a schematic diagram of the control loop of the electrical system in Embodiment 17.

As shown in FIG. 18, an online check contact signal sampling unit 6 is provided with a contact sampling circuit. In this embodiment, the contact sampling circuit includes a first Hall current sensor H1, and a second Hall current sensor H2. The first Hall current sensor H1, the second Hall current sensor H2, and a contact $P_J$ of a gas density relay are connected in series to form a closed loop. The contact $P_J$ of the gas density relay is connected between the first Hall current sensor H1 and the second Hall current sensor H2. An output terminal of the first Hall current sensor and an output terminal of the second Hall current sensor are both connected to an intelligent control unit.

With the above contact sampling circuit, it may be easily known whether the state of the contact $P_J$ of the gas density relay 1 is open or closed. Specifically, when the contact $P_J$ is closed, the closed loop is powered on, and current flows between the first Hall current sensor H1 and the second Hall current sensor H2 to generate induced electromotive force. When the contact $P_J$ is open, the closed loop is powered off, and no current flows between the first Hall current sensor H1 and the second Hall current sensor H2 to generate zero induced electromotive force.

In this embodiment, the intelligent control unit 7 mainly consists of a processor 71 (U1), a power supply 72 (U2), a communication module 73 (U3), an intelligent control unit protection circuit 74 (U4), a display and output device 75 (U5), and a data storage 76 (U6) device.

Embodiment 18

Figure 19:
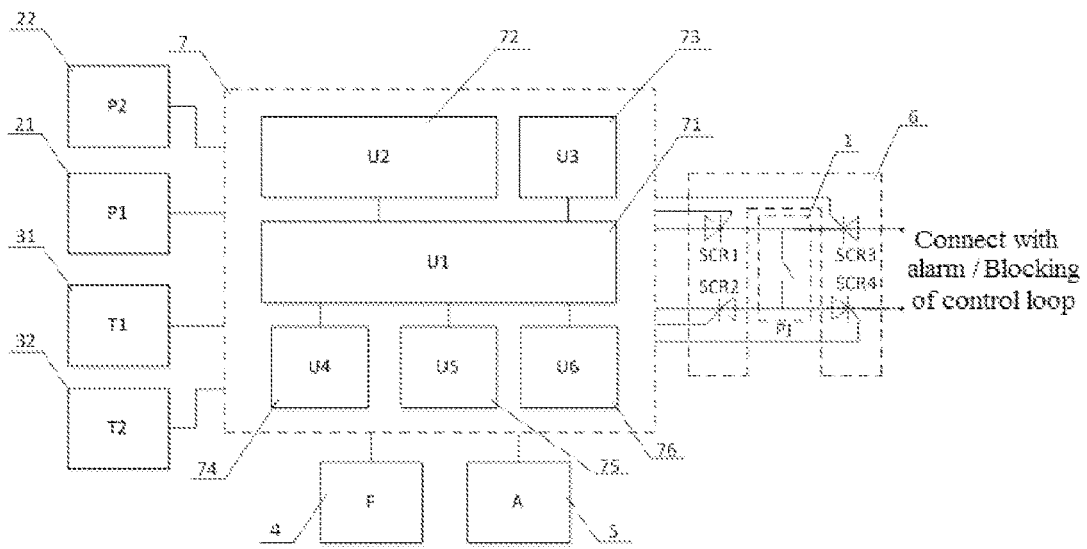
FIG. 19 is a schematic diagram of the control loop of the electrical system in Embodiment 18.

As shown in FIG. 19, an online check contact signal sampling unit is provided with a contact sampling circuit. In this embodiment, the contact sampling circuit includes a first silicon controlled rectifier SCR1, a second silicon controlled rectifier SCR2, a third silicon controlled rectifier SCR3, and a fourth silicon controlled rectifier SCR4.

The first silicon controlled rectifier SCR1 is connected in series with the third silicon controlled rectifier SCR3, and the second silicon controlled rectifier SCR2 and the fourth silicon controlled rectifier SCR4 are connected in series to form a series parallel closed circuit with the series circuit composed of the first silicon controlled rectifier SCR1 and the third silicon controlled rectifier SCR3; one end of contact $P_J$ of gas density relay 1 is electrically connected with the circuit between the first silicon controlled rectifier SCR1 and the third silicon controlled rectifier SCR3 through the circuit, while the other end is electrically connected with the circuit between the second silicon controlled rectifier SCR2 and the fourth silicon controlled rectifier SCR4 through the circuit. As shown in FIG. 6, a series-parallel connected circuit described here is a circuit in which the above elements and components are connected in parallel and in series.

Specifically, the cathode of the first silicon controlled rectifier SCR1 will be connected with the cathode of the second silicon controlled rectifier SCR2 to form the online check contact signal sampling unit 6, the output end of which is connected with the intelligent control unit 7; the anode of the first silicon controlled rectifier SCR1 is connected with the cathode of the third silicon controlled rectifier SCR3; the anode of the second silicon controlled rectifier SCR2 is connected with the cathode of the fourth silicon controlled rectifier SCR4; the anode of the third silicon controlled rectifier SCR3 and the anode of the fourth silicon controlled rectifier SCR4 are connected with the input end of the online check contact signal sampling unit 6. Control electrodes of the first silicon controlled rectifier SCR1, the second silicon controlled rectifier SCR2, the third silicon controlled rectifier SCR3, and the fourth silicon controlled rectifier SCR4 are all connected to the intelligent control unit 7. The intelligent control unit 7 may control the turn-on or turn-off of the silicon controlled rectifier.

The working process of this embodiment is as follows:

When check is not performed and operation is normal, a contact $P_J$ is cut off. The contact sampling circuit triggers the third silicon controlled rectifier SCR3 and the fourth silicon controlled rectifier SCR4. The third silicon controlled rectifier SCR3 and the fourth silicon controlled rectifier SCR4 are in a conductive state. A control loop of the a contact signal is in a working state. Then, the contact sampling circuit will not trigger the first silicon controlled rectifier SCR1 and the second silicon controlled rectifier SCR2, and the cathode of the first silicon controlled rectifier SCR1 and the second silicon controlled rectifier SCR2 doesn't have the voltage output, and is under the disconnected state.

During the check, the contact sampling circuit does not trigger the first silicon controlled rectifier SCR3 and the fourth silicon controlled rectifier SCR4, but triggers the first silicon controlled rectifier SCR1 and the second silicon controlled rectifier SCR2. At this time, the third silicon controlled rectifier SCR3 and the fourth silicon controlled rectifier SCR4 are in a non-conductive state. The contact $P_J$ is isolated from the contact signal control loop. The first silicon controlled rectifier SCR1 and the second silicon controlled rectifier SCR2 are in a conductive state. The contact $P_J$ communicates with the online check contact signal sampling unit 6 and is connected to the intelligent control unit 7.

The online check contact signal sampling unit 6 may also mixedly and flexibly consist of a solid state relay or an electromagnetic relay and the silicon controlled rectifier.

In this embodiment, the intelligent control unit 7 mainly consists of a processor 71 (U1), a power supply 72 (U2), a communication module 73 (U3), an intelligent control unit protection circuit 74 (U4), a display and output device 75 (U5), and a data storage 76 (U6) device.

Embodiment 19

Figure 20:
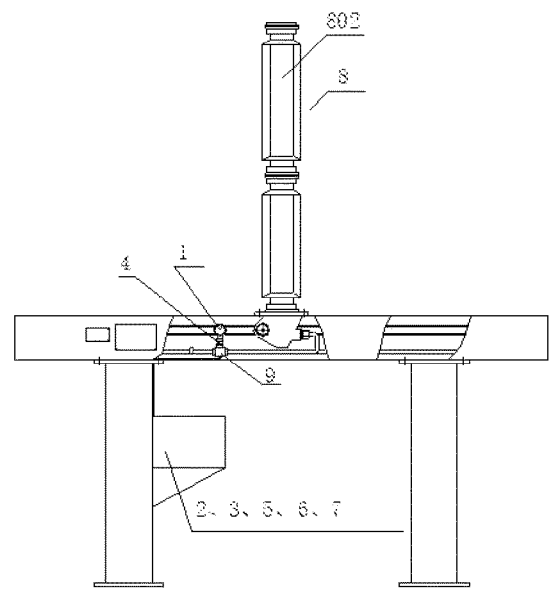
FIG. 20 is a structural schematic diagram of the gas path of the electrical system in Embodiment 19.

FIG. 20 is a structural diagram of a gas path of an electrical system of an preferable embodiment of the present disclosure. As shown in FIG. 20, electric equipment 8 is a sulfur hexafluoride high-voltage circuit breaker, and includes an air chamber 802 arranged in the electric equipment 8. The gas density relay is installed in the internal accumulation space of horizontal frame, one end of connecting pipe is connected with the gas inlet of valve 4, and the other end of connecting pipe is extended to the lower part of air chamber 802 along the horizontal frame, and connected with gas chamber 802 from the lower part. The gas inlet of valve 4 is sealing connected with air chamber 802 of the electrical equipment 8; the gas outlet of valve 4 is connected with the gas path of the gas density relay 1. The probe of pressure sensor 2 is located on the gas path of gas density relay 1; the pressure regulating mechanism 5 is connected with the gas path of gas density relay 1; the online check contact signal sampling unit 6 is connected respectively with the gas density relay 1 and the intelligent control unit 7. The pressure sensor 2, temperature transducer 3, valve 4 and the pressure regulating mechanism 5 are also respectively connected with the intelligent control unit 7. The part of pressure sensor 2 except for probe, the part of temperature transducer 3 except for probe, the pressure regulating mechanism 5, the online check contact signal sampling unit 6, and the intelligent control unit 7 shall be fixed on the mounting plate of vertical frame.

When the contacts of the density relay are checked at high temperatures, low temperatures, normal temperatures, and 20° C. ambient temperature, the electrical system with online sampling and check function has different error judgment requirements for the contacts; the specific requirements can be implemented according to the relevant standards as per the temperature; the system can compare the error performance of the gas density relay under different temperatures and different time periods, that is, the comparison in different periods but the same temperature range, so as to judge the performance of the density relay; the system has the comparison among previous periods and comparison between the history and the present. The system can also perform a physical examination of the density relay. If necessary, the contact signal of gas density relay can be checked at any time; the system may judge whether the density values of gas density relay and monitored electrical equipment are normal, that is, the system can judge, analyze and compare the normal and abnormal density value, gas density relay, pressure sensor and temperature transducer of electrical equipment, so as to judge, compare and analyze the states of gas density monitoring device, gas density relay and other electrical equipment; the system can also monitor the contact signal state of gas density relay and transmit its state remotely. The open or closed contact signal state of gas density relay can be known in the background, so as to realize more monitoring and improve reliability. The system can also detect and determine the temperature compensation performance of the gas density relay; the system can also test, or test and judge the contact resistance of the gas density relay; and the insulation performance of the gas density relay.

To sum up, the invention provides an electrical system with online sampling and check function and its check method. Composed of a gas path (through pipeline) connection part, a pressure regulation part, a signal measurement control part, etc., the system mainly carries out online check and measurement of the contact value (pressure value during alarm/blocking action) of the gas density relay under the ambient temperature and automatically converts the value into the corresponding pressure value at 20° C. to detect the performance of the contact (alarm and blocking) value of the gas density relay online. The installation positions of gas density relay, pressure sensor, temperature transducer, pressure regulating mechanism, valve, online check contact signal sampling unit and intelligent control unit can be flexibly combined. For example, gas density relay, pressure sensor, temperature transducer, online check contact signal sampling unit and intelligent control unit can be combined for integrated design or split design; they can also be installed on the housing, or on the multichannel joint or connected together by connecting pipes. The valve may be directly connected to the electrical equipment, or connected to the electrical equipment through the self-sealing valve or the air pipe. The pressure sensor, the temperature transducer, the online check contact signal sampling unit and the intelligent control unit can be combined together or integrally designed; the pressure sensor and the temperature transducer can be combined together or integrally designed; and the online check contact signal sampling unit and the intelligent control unit can be combined together or integrally designed. In short, the structure is not limited to one type.

The gas density relay in the electrical system with online sampling and check function and its check method, also called as gas density monitoring device in general, can refer to the gas density relay whose constituent elements are designed into an integrated structure, or the gas density relay whose constituent elements are designed into an integral structure.

This application has compact and reasonable structure arrangement, and various components have better anti-rust and anti-vibration abilities, are firmly installed and reliably used. The connection, disassembly and assembly of various pipelines of the electrical system are easy to operate, and the equipment and components are convenient for maintenance. In this application, the gas density relay check can be completed without maintainer at the site, so as to greatly improve the reliability of power grid, increase work efficiency and reduce operating and maintenance cost.

The specific embodiments of the present disclosure are described in details above, and used as examples only. The present disclosure is not limited to the specific embodiments described above. For the personnel skilled in the art, any equal modification and replacement to the present disclosure shall be in the scope of the present disclosure. Therefore, the equal change and modification made without deviating from the spirit and scope of the present disclosure shall be covered within the scope of the present disclosure.

The invention claimed is:

1. An electrical system with online sampling and check function, characterized in that the electrical system comprises:

an electric equipment, in which an air chamber is arranged, and the air chamber is filled with insulating gas;
a gas density relay, which is mounted outside the air chamber of the electrical equipment, or mounted outside the air chamber of the electrical equipment via a valve;
a gas inlet of the valve is connected with the air chamber of the electrical equipment, and a gas outlet is connected with a gas path of the gas density relay;
a gas path of a pressure regulating mechanism is connected with the gas path of the gas density relay, and the pressure regulating mechanism is configured for pressure rise and fall of a gas path pressure of gas density relay, to enable a contact signal action of the gas density relay;
a gas density detection sensor, which is communicated with the gas density relay;
an online check contact signal sampling unit is connected with the gas density relay and configured to sample a contact signal of the gas density relay under the ambient temperature;
a intelligent control unit is respectively connected with the gas density detection sensor, the pressure regulating mechanism, the valve and the online check contact signal sampling unit; the intelligent control unit is configured to at least one of manage the closing or opening of the valve, control the pressure regulating mechanism, collect pressure values, temperature values, gas density values, as well as check at least one of the contact signal operating value and contact signal return value of the gas density relay;
the contact signal operating value and contact signal return value of the gas density relay include at least one of alarm signals and/or blocking signals.

2. The electrical system with online sampling and check function according to claim 1, characterized in that the electrical system comprises a support and the air chamber of the electrical equipment is located above or below the support; the support comprises a vertical frame and a horizontal frame, the gas density relay is located in a internal space of the horizontal frame; the gas inlet of the valve is connected with one end of a connecting pipe, and the other end of the connecting pipe extends to the lower part of the gas chamber a long the horizontal frame and connects the gas chamber from the lower part of the gas chamber.

3. The electrical system with online sampling and check function according to claim 1, characterized in that at least one of the gas density sensor is arranged on the gas density relay; the pressure regulating mechanism is arranged on the gas density relay; and the gas density sensor, the online check contact signal sampling unit and the intelligent control unit are installed on the gas density relay.

4. The electrical system with online sampling and check function according to claim 1, characterized in that at least one of the gas density sensor comprises at least one pressure sensor and at least one temperature transducer, where a probe of the pressure sensor is installed on the gas path of the gas density relay, a probe of the temperature transducer is installed on or outside the gas path of the gas density relay, or in or outside the gas density relay; the gas density sensor is a gas density transmitter composed of a pressure sensor and a temperature transducer; and the gas density sensor is a density sensor using quartz tuning fork technology.

5. The electrical system with online sampling and check function according to claim 1, characterized in that at least one of:

the pressure regulating mechanism is a sealed air chamber, and at least one of the heating element and a refrigeration element are provided inside or outside the sealed air chamber; during check, at least one of heating through the heating element and refrigerating through the refrigeration element cause a gas temperature change in the sealed air chamber, and further completes a pressure rise and fall of gas density relay;
the pressure regulating mechanism is a cavity with an opening at one end, and the other end of the cavity is connected with the gas path of the gas density relay; a piston is set in the cavity; one end of the piston is connected with a regulating rod; the outer end of the regulating rod is connected with a drive part; the other end of the piston stretches into the opening at one end and contacts with the inner wall of the cavity in a sealed manner; a drive part drives the regulating rod and further drives a piston moves in the cavity;
the pressure regulating mechanism is the sealed air chamber, at least one of the heating element and refrigeration element are provided inside or outside the sealed air chamber, an hermetically sealed contacts exist between the piston and the inner wall of sealed air, chamber, and the drive part is provided outside the sealed air chamber, and pushes the piston to move inside the cavity through an electromagnetic force;
the pressure regulating mechanism is an airbag with one end connected to the drive part, the airbag changes in volume under the drive of the drive part, and the airbag is connected with the gas density relay;
the pressure regulating mechanism is a bellows, one end of the bellows is connected with the gas density relay, and the other end of the bellows is retractable under the drive of the drive part;
the pressure regulating mechanism is a deflation valve, which is a solenoid valve or a valve with electrically motorized operation;
the pressure regulating mechanism is a compressor; and
the pressure regulating mechanism is a pump, and the pump comprises one of a pressure pump, a booster pump, an electrical gas pump and an electromagnetic gas pump;
the drive part includes any of a magnetic force, motor, reciprocating mechanism, Carnot cycle mechanism and pneumatic component.

6. The electrical system with online sampling and check function according to claim 1, characterized in that the online check contact signal sampling unit has at least two groups of independent sampling contacts, can automatically complete a check of at least two contacts at the same time, and can continuously measure without replacing contacts or reselecting contacts; where,
a contact of the at least two groups of independent sampling contacts includes at least one of an alarm contact, an alarm contact+a blocking contact, an alarm contact+a blocking 1 contact+a blocking 2 contact, and an alarm contact+a blocking contact+an overpressure contact.

7. The electrical system with online sampling and check function according to claim 1, characterized in that at least one of:
a contact of the gas density relay is a density relay normally open and the online check contact signal sampling unit comprises a first connecting circuit and a second connecting circuit, where the first connecting circuit is connected with the contact of the gas density relay and a contact signal control loop and the second connecting circuit connects the contact of the gas density relay with the intelligent control unit; in the non-check state, the second connecting circuit is disconnected or isolated, and the first connecting circuit is closed; in the check state, the online check contact signal sampling unit cuts off the first connecting circuit, connects the second connecting circuit, and connects the contact of the gas density relay with the intelligent control unit;

the contact of the gas density relay is a normally-closed density relay, the online check contact signal sampling unit includes the first connecting circuit and the second connecting circuit, the first connecting circuit is connected with the contact of the gas density relay and the contact signal control loop, and the second connecting circuit is connected with the contact of the gas density relay and the intelligent control unit; under the non-check state, the second connecting circuit is open or isolated, and the first connecting circuit is closed; under the check state, the online check contact signal sampling unit closes the contact signal control loop, cuts off the connection between the contact of the gas density relay and the contact signal control loop, connects the second connecting circuit, and connects the contact of the gas density relay with the intelligent control unit.

8. The electrical system with online sampling and check function according to claim 7, characterized in that the first connecting circuit comprises a first relay, the second connecting circuit comprises a second relay, and the first relay and the second relay are two independent relays or same relays; the first relay is provided with at least one normally closed contact, the second relay is provided with at least one normally open contact, and the at least one normally closed contact and the at least one normally open contact maintain opposite open/close state; the at least one normally closed contact is connected in series in the contact signal control loop, and the at least one normally open contact is connected to the contact of the gas density relay;

under the non-check state, the at least one normally-closed contact is closed, the at least one normally-open contact is open, and the gas density relay monitors output statuses of the at least one normally open contact and at least one normally closed contact in real time;

under the check state, the at least one normally-closed contact is open, the at least one normally-open contact is closed, and the contact of the gas density relay is connected with the intelligent control unit by means of the at least one normally-open contact.

9. The electrical system with online sampling and check function according to claim 7, characterized in that the online check contact signal sampling unit is provided with at least one of:

a contact sampling circuit, which comprises a photocoupler and a resistance; the photocoupler comprises a LED and a phototransistor; the LED and the contact of the gas density relay are connected in series to form a closed circuit; the emitter of the phototransistor is grounded; the collector of the phototransistor is connected with the intelligent control unit, and the collector of the phototransistor is also connected to a power supply through the resistance; when the contact of the gas density relay is closed, the closed circuit is energized, the LED emits light, the light turns on the phototransistor, and the collector of the phototransistor outputs a low level; when the contact of the gas density relay is disconnected, the closed circuit is disconnected, the LED does not emit light, the phototransistor is cut off, and the collector of the phototransistor outputs a high level;

the contact sampling circuit comprises a first photocoupler and a second photocoupler; the LED of the first photocoupler and a LED of the second photocoupler are connected in parallel or directly in parallel through a current limiting resistor respectively, and then connected in series with the contact of the gas density relay to form a closed circuit, and the LED of the first photocoupler and the second photocoupler is connected oppositely; the collector of the phototransistor of the first photocoupler and that of the second photocoupler are connected with the power supply through a resistive divider, the emitter of the phototransistor of the first photocoupler is connected with that of the second photocoupler to form an output end which is connected with the intelligent control unit, and grounded through a resistor; when the contact is closed, the closed circuit is energized, the first photocoupler is on, the second photocoupler is off, and the emitter of the phototransistor of the first photocoupler outputs a high level; alternatively, the first photocoupler is cut off, the second photocoupler is turned on, and the emitter of the phototransistor of the second photocoupler outputs a high level; when the contact is disconnected, the closed circuit is powered off, the first photocoupler and the second photocoupler are cut off, and the emitter of the phototransistor of the first photocoupler and the second photocoupler outputs a low level;

the contact sampling circuit comprises a first Hall current sensor and a second Hall current sensor, where contacts of the first Hall current sensor, the second Hall current sensor and the gas density relay are connected in series to form a closed circuit, and the contact of the gas density relay is connected between the first Hall current sensor and the second Hall current sensor; the output end of the first Hall current sensor and that of the second Hall current sensor are connected with the intelligent control unit; when the contact is closed, the closed circuit is energized, and current flows between the first Hall current sensor and the second Hall current sensor to generate an induced potential; when the contact is disconnected, the closed circuit is powered off, making no current flow between the first Hall current sensor and the second Hall current sensor, and induced potential zero;

and the contact sampling circuit comprises a first silicon controlled rectifier, a second silicon controlled rectifier, a third silicon controlled rectifier and a fourth silicon controlled rectifier; the first and second silicon controlled rectifiers are connected in series, and the second and fourth silicon controlled rectifiers are connected in series to form a series parallel closed circuit with the series circuit composed of the first and third silicon controlled rectifier; one end of the contact of the gas density relay is electrically connected with a circuit between the first and third silicon controlled rectifiers through the circuit between the first and third silicon controlled rectifiers, and the other end is electrically connected to the circuit between the second and fourth silicon controlled rectifiers through the circuit between the second and fourth silicon controlled rectifiers.

10. The electrical system with online sampling and check function according to claim 1, characterized in that at least one of:

the intelligent control unit obtains a gas density value from the gas density values collected by the gas density detection sensor;

the intelligent control unit obtains the pressure value from the pressure values and temperature value from the temperature values collected by the gas density detection sensor to complete online monitoring of the gas density of the electrical equipment by the gas density relay.

11. The electrical system with online sampling and check function according to claim 1, characterized in that at least one of:

the intelligent control unit acquires the gas density value from the gas density values collected by the gas density detection sensor when the contact signal of the gas density relay under the ambient temperature acts or switches, and completes online check of the gas density relay;

the intelligent control unit acquires the pressure value from the pressure values and temperature value from the temperature values collected by the gas density sensor when the contact signal of the gas density relay under the ambient temperature is operated or switched, and converts them into a pressure value corresponding to 20° C. according to gas pressure-temperature characteristics, the gas density value, and completes an online check of the gas density relay.

12. The electrical system with online sampling and check function according to claim 1, characterized in that at least one of:

the gas density relay is provided with a comparison density value output signal which is connected with the intelligent control unit;

the gas density relay is provided with a comparison pressure value output signal which is connected with the intelligent control unit; when the gas density relay outputs the output signal of the comparison density value, the intelligent control unit collects the current gas density value for comparison and checks the comparison density value of the gas density relay, while the intelligent control unit or the background compares the results for determination and gives an anomaly prompt if the error is out of tolerance;

when the gas density relay outputs relative density value output signals, the intelligent control unit collects the current gas density value for comparison to complete mutual check on the gas density relay and the gas density detection sensor, and the intelligent control unit or background performs determination on a comparison result and issues, if the error is out of tolerance, an abnormal prompt; and when the gas pressure relay outputs relative pressure value output signals, the intelligent control unit collects a current pressure value for comparison to complete mutual check on the gas pressure relay and the gas pressure detection sensor, and the intelligent control unit or background performs determination on the comparison result and issues, if the error is out of tolerance, an abnormal prompt.

13. The electrical system with online sampling and check function according to claim 1, characterized in that the electrical system comprises at least two gas density sensors, and each gas density sensor comprises a pressure sensor and a temperature transducer; the gas density values detected by each gas density sensor are compared to complete a mutual check of each gas density sensor.

14. The electrical system with online sampling and check function according to claim 1, characterized in that the gas density detection sensor comprises at least two pressure sensors, and the pressure values collected by each pressure sensor are compared to complete a mutual check of each pressure sensor.

15. The electrical system with online sampling and check function according to claim 1, characterized in that the gas density detection sensor comprises at least two temperature transducers, and the temperature values collected by each temperature transducer are compared to complete a mutual check of each temperature transducer.

16. The electrical system with online sampling and check function according to claim 1, characterized in that the gas density detection sensor comprises at least one pressure sensor and at least one temperature transducer; and at least one of:

a pressure value collected by each pressure sensor and a temperature value collected by each temperature transducer are randomly arranged and combined, and each combination is converted into multiple pressure values corresponding to 20° C. according to the gas pressure temperature characteristics, the gas density values; each gas density value is compared to complete a mutual check of each pressure sensor and each temperature transducer;

the pressure value collected by each pressure sensor and the temperature value collected by each temperature transducer are all arranged and combined, and each combination is converted into multiple pressure values corresponding to 20° C. according to the gas pressure temperature characteristics, the gas density values; each gas density value is compared to complete a mutual check of each pressure sensor and each temperature transducer; and a multiple gas density values obtained by each pressure sensor and temperature transducer are compared with output signal of the gas density relay, to complete a mutual check of the gas density relay, pressure sensor and temperature transducer.

17. A check method of gas density relay, characterized in that it comprises:

in a working state, monitoring by the gas density relay gas density value in an electrical equipment;

according to the set check time and the gas density value, and under a condition that a check of the gas density relay is permitted:

closing valve via an intelligent control unit;

driving a pressure regulating mechanism by the intelligent control unit to slowly decrease gas pressure and enable a contact action of the gas density relay;

transmitting the contact action to the intelligent control unit through an online check contact signal sampling unit;

obtaining by the intelligent control unit the gas density value according to pressure value and temperature value during the contact action, or directly obtaining the gas density value, detecting a contact signal operating value of the gas density relay, and completing check of the contact signal operating value of the gas density relay;

when all check of contact signals is completed, opening by the intelligent control unit the valve.

18. The check method for the gas density relay according to claim 17, wherein the method comprises the following step:

in the normal working state, monitoring by the gas density relay the gas density value in the electrical equipment, and at a same time, monitoring by the gas density relay the gas density value in the electrical equipment online via a gas density detection sensor and the intelligent control unit;

according to the set check time and the gas density value, and under a condition that the check of the gas density relay is permitted:

closing the valve via the intelligent control unit;

adjusting the online check contact signal sampling unit to a check state; in the check state, the online check contact signal sampling unit cuts off a contact signal control loop of the gas density relay and connects a contact of the gas density relay to the intelligent control unit;

driving the pressure regulating mechanism by the intelligent control unit to slowly decrease the gas pressure and enable the contact action of the gas density relay; transmitting the contact action of the gas density relay to the intelligent control unit through the online check contact signal sampling unit; obtaining the intelligent control unit the gas density value according to the pressure value and temperature value during the contact action of the gas density relay, or directly obtaining the gas density value, detecting the contact signal operating value of the gas density relay, and completing the check of the contact signal operating value of the gas density relay;

driving the pressure regulating mechanism by the intelligent control unit to slowly increase the gas pressure and enable a contact reset of the gas density relay; the contact reset of the gas density relay is transmitted to the intelligent control unit through the online check contact signal sampling unit; obtaining the intelligent control unit the gas density value according to the pressure value and temperature value during the contact reset, or directly obtaining the gas density value, detecting a contact signal return value of the gas density relay, and completing a check of the contact signal return value of the gas density relay;

when all check of contact signals is completed, opening the intelligent control unit the valve and adjusting the online check contact signal sampling unit to the working state, and the contact signal control loop of the gas density relay returns to Wan operation state.

* * * * *